(12) United States Patent
Miller et al.

(10) Patent No.: US 10,806,041 B2
(45) Date of Patent: Oct. 13, 2020

(54) MOUNTING STRUCTURES FOR A BANNER DISPLAY

(71) Applicant: Daktronics, Inc., Brookings, SD (US)

(72) Inventors: Kent Shane Miller, Brookings, SD (US); Ashton Flowers, Shanghai (CN); Mark Bryon Carsrud, Volga, SD (US)

(73) Assignee: Daktronics, Inc., Brookings, SD (US)

( * ) Notice: Subject to any disclaimer, the term of this patent is extended or adjusted under 35 U.S.C. 154(b) by 0 days.

(21) Appl. No.: 16/477,512

(22) PCT Filed: Jan. 12, 2018

(86) PCT No.: PCT/US2018/013615
§ 371 (c)(1),
(2) Date: Jul. 11, 2019

(87) PCT Pub. No.: WO2018/132734
PCT Pub. Date: Jul. 19, 2018

(65) Prior Publication Data
US 2019/0350094 A1   Nov. 14, 2019

Related U.S. Application Data

(60) Provisional application No. 62/508,477, filed on May 19, 2017, provisional application No. 62/446,179, filed on Jan. 13, 2017.

(51) Int. Cl.
*H05K 5/02* (2006.01)
*G09F 9/302* (2006.01)
(Continued)

(52) U.S. Cl.
CPC ......... *H05K 5/0204* (2013.01); *G09F 9/3026* (2013.01); *G09F 15/0006* (2013.01);
(Continued)

(58) Field of Classification Search
CPC .. H05K 5/0204; H05K 5/0021; H05K 5/0017; G09F 15/0006; G09F 9/3026;
(Continued)

(56) References Cited

U.S. PATENT DOCUMENTS 3,889,736 A * 6/1975 Firks .................. A47G 5/00
  160/135
4,197,341 A   4/1980 Rule
(Continued)

FOREIGN PATENT DOCUMENTS

CN   202307008 U   7/2012
CN   110537217 A   12/2019
(Continued)

OTHER PUBLICATIONS

"International Application Serial No. PCT/US2018/013605, International Preliminary Report on Patentability dated Mar. 27, 2019", 8 pgs.

(Continued)

*Primary Examiner* — Daniel P Wicklund
*Assistant Examiner* — Sagar Shrestha
(74) *Attorney, Agent, or Firm* — Schwegman Lundberg & Woessner, P.A.

(57) ABSTRACT

A display comprises a mounting structure comprising one or more structural members (122) having a first face (136) and a second face (138), a first plurality of display modules (112) mounted to the first faces of the one or more structural members with a plurality of magnetic mounts (19A, 110B), wherein the first plurality of display modules are arranged in proximity to form a first display surface, and one or more tension members coupled to the mounting structure, wherein the one or more tension members support the display when the one or more tension members are connected to a support structure.

18 Claims, 13 Drawing Sheets

(51) Int. Cl.
*G09F 15/00* (2006.01)
*H05K 5/00* (2006.01)
*G06F 3/14* (2006.01)

(52) U.S. Cl.
CPC ......... *H05K 5/0017* (2013.01); *H05K 5/0021* (2013.01); *G06F 3/1446* (2013.01)

(58) Field of Classification Search
CPC ... G09F 9/35; G09F 9/33; G09F 19/22; G06F 3/1446
See application file for complete search history.

(56) References Cited

U.S. PATENT DOCUMENTS

| | | | |
|---|---|---|---|
| 6,263,602 B1 | 7/2001 | Seiber et al. | |
| 6,647,652 B1* | 11/2003 | Seiber | G09F 7/18 40/606.1 |
| 9,140,279 B2* | 9/2015 | Frias | F16B 5/01 |
| 9,301,411 B2 | 3/2016 | Shin et al. | |
| 2003/0056413 A1* | 3/2003 | Wiemer | G09F 9/3026 40/730 |
| 2005/0282586 A1* | 12/2005 | Rutherford | H01Q 1/1207 455/562.1 |
| 2008/0259547 A1 | 10/2008 | Kim | |
| 2009/0250575 A1* | 10/2009 | Fullerton | G09F 7/04 248/206.5 |
| 2011/0181493 A1* | 7/2011 | Williams | G06F 3/1446 345/1.3 |
| 2012/0020056 A1 | 1/2012 | Yamagata et al. | |
| 2012/0236509 A1 | 9/2012 | Cope et al. | |
| 2012/0262660 A1 | 10/2012 | Fujiwara et al. | |
| 2014/0016302 A1* | 1/2014 | Shin | H05K 5/0017 362/97.1 |
| 2016/0348854 A1* | 12/2016 | Wu | G09F 9/33 |
| 2017/0006727 A1* | 1/2017 | Ryu | H01L 25/0753 |
| 2017/0159876 A1* | 6/2017 | Brashnyk | H01F 7/0252 |
| 2019/0371212 A1 | 12/2019 | Miller et al. | |

FOREIGN PATENT DOCUMENTS

| | | |
|---|---|---|
| CN | 110537218 A | 12/2019 |
| EP | 2685444 A2 | 1/2014 |
| EP | 2685444 B1 | 3/2017 |
| WO | WO-2011125307 A1 | 10/2011 |
| WO | WO-2014172848 A1 | 10/2014 |
| WO | WO-2016109439 A1 | 7/2016 |

OTHER PUBLICATIONS

"International Application Serial No. PCT/US2018/013605, International Search Report dated Jun. 5, 2018", 5 pgs.
"International Application Serial No. PCT/US2018/013605, Written Opinion dated Jun. 5, 2018", 6 pgs.
"International Application Serial No. PCT/US2018/013605, Written Opinion dated Dec. 5-6, 2018", 6 pgs.
"International Application Serial No. PCT/US2018/013615, International Preliminary Report on Patentability dated Mar. 27, 2019", 8 pgs.
"International Application Serial No. PCT/US2018/013615, International Search Report dated Jun. 5, 2018", 6 pgs.
"International Application Serial No. PCT/US2018/013615, Written Opinion dated Jun. 5, 2018", 6 pgs.
"International Application Serial No. PCT/US2018/013615, Written Opinion dated Dec. 11, 2018", 6 pgs.
"U.S. Appl. No. 16/477,508, Preliminary Amendment filed Jul. 11, 2019", 7 pgs.
"European Application Serial No. 18709158.2 Response to Communication Pursuant to Rules 161(1) and 162 EPC filed Feb. 25, 2020".
"European Application Serial 18709424.8, Response filed Feb. 28, 2020 to Communication pursuant to Rules 161(1) and 162 EPC 98-03-19", 21 pgs.
"International Application Serial No. PCT/2018/013615, Response filed Nov. 13, 2018 to Written Opinion dated Jun. 5, 2018", 5 pgs.
"International Application Serial No. PCT/US2018/013605, Response filed Nov. 13, 2018 to Written Opinion dated Jun. 5, 2018", 5 pgs.
"Australian Application Serial No. 2018207168, First Examination Report dated Jun. 19, 2020", 4 pgs.
"Australian Application Serial No. 2018207628, First Examination Report dated Jun. 19, 2020", 4 pgs.

* cited by examiner

MOUNTING STRUCTURES FOR A BANNER DISPLAY

CROSS-REFERENCE TO RELATED APPLICATIONS

This application is a U.S. National Stage Filing under 35 U.S.C. § 371 from International Application No. PCT/US2018/013615, filed on Jan. 12, 2018, and published as WO 2018/132734 A1 on Jul. 19, 2018, which application claims priority to U.S. Provisional Application Ser. No. 62/446,179, filed on Jan. 13, 2017, entitled "COMPOSITE MOUNTING STRUCTURE FOR A BANNER DISPLAY," and U.S. Provisional Application Ser. No. 62/508,477, filed on May 19, 2017, entitled "MOUNTING STRUCTURES FOR A BANNER DISPLAY," the disclosures of which are incorporated herein by reference in their entireties.

BACKGROUND

Displays comprising a plurality of light-emitting elements, or display modules, are used for the display of information. In some applications, such as digital billboards or scoreboards, individual display modules can be connected together and operated collectively to form a larger display. The larger display can be hung from a support structure, such as the ceiling of a building or a support beam, to provide a display with the appearance of an overhanging banner, often referred to as a banner display.

SUMMARY

A banner display system can include a plurality of display modules that are hung from a support structure with one or more supporting tension members. The plurality of display modules are mounted to a mounting structure with one or more magnetic mounts. A first end of each magnetic mount is coupled to either the structural member or the display module, i.e., by fastening or adhering the first end to the structural member or the display module. The magnetic mount includes a mounting magnet located at or proximate to a second end of the magnetic mount that opposes the first end. A mating structure that can be magnetically engaged by the mounting magnet, such as a mating metallic structure or a mating magnet, is coupled to or incorporated in the other of the structural member or the display module that is not coupled to the magnetic mount first end. For example, if the magnetic mount first end is coupled to the structural member, then the mating structure is coupled to a corresponding location on the display module. The display module is mounted to the support structure by positioning the display module so that the second ends of the magnetic mounts are positioned to be in close proximity to the location of the mating structures so that each first magnet magnetically engages a corresponding mating structure. The magnetic engagement between the mounting magnet on each of the magnetic mounts and its corresponding mating structure is sufficient to hold the display module in place relative to the support structure.

This summary is intended to provide an overview of subject matter of the present patent application. It is not intended to provide an exclusive or exhaustive explanation of the invention. The detailed description is included to provide further information about the present patent application.

BRIEF DESCRIPTION OF THE FIGURES

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

In the following Detailed Description, reference is made to the accompanying drawing which form a part hereof. The drawings show, by way of illustration, examples of banner displays and examples of systems for hanging a banner display to a support structure, such as the ceiling of a building or a support beam. The examples are described in sufficient detail to enable those skilled in the art to practice, and it is to be understood that other embodiments can be utilized and that changes can be made without departing from the scope of the present disclosure. Therefore, the following Detailed Description is not to be taken in a limiting sense, and the scope of the present disclosure is defined by the appended claims and their equivalents.

Banner Display

Figure 1:
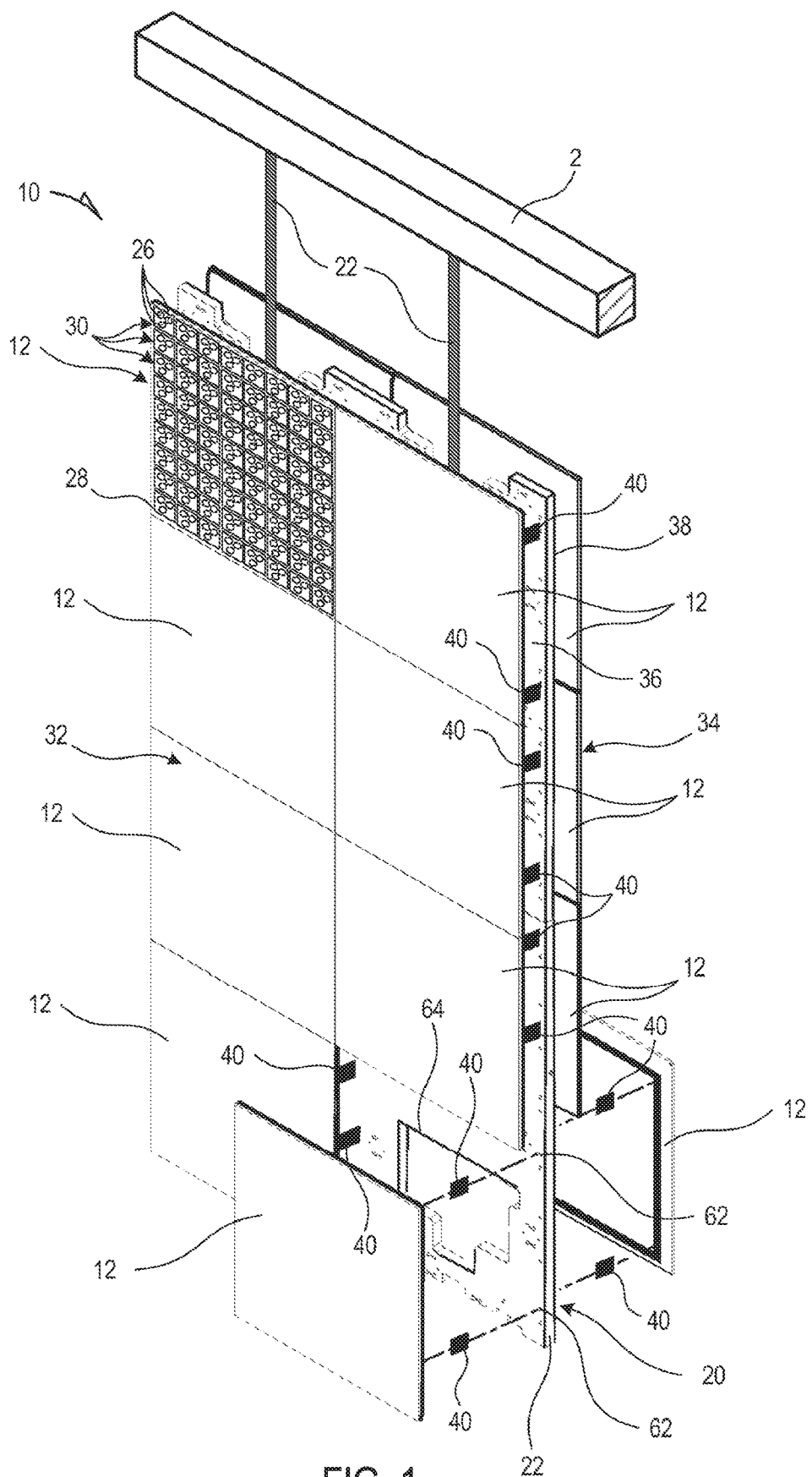
FIG. 1 is a partially exploded isometric view of an example banner display for the display of visual information.
Figure 2:
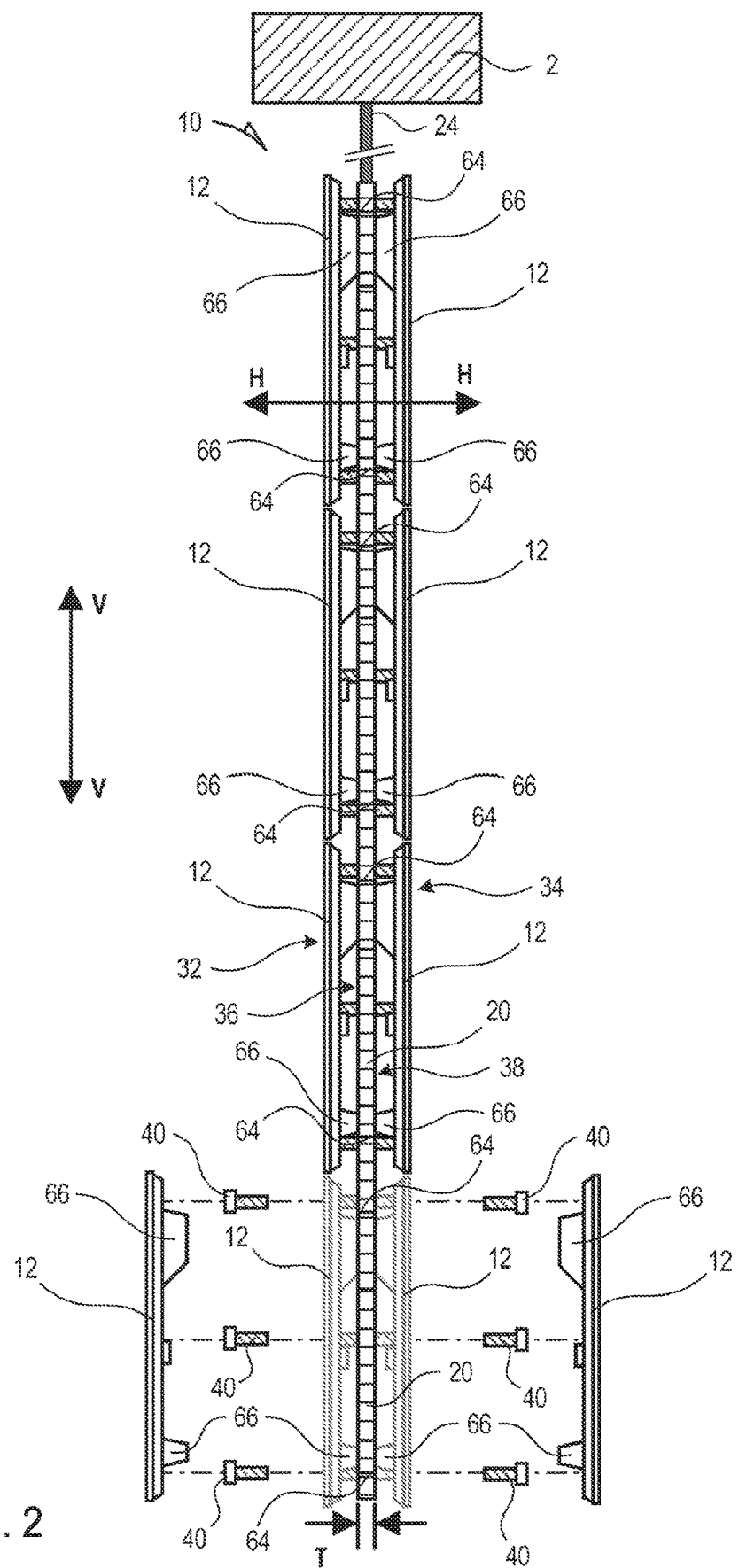
FIG. 2 is a cross-sectional side view of the example banner display of FIG. 1.

FIGS. 1 and 2 shows several views of an example banner display 10. The banner display 10 is configured to be supported in a hanging manner from a support 2. The support 2 can be, for example, a portion of a ceiling of a building or a support beam. The banner display 10 includes a plurality of display modules 12 that are mounted to and supported by a mounting structure 20. As described in more detail below, the mounting structure 20 comprises one or more structural members 22 that possess sufficient structural integrity to support the plurality of display modules 12.

In an example, the banner display 10 is connected to the support 2 and is hung from the support 2 by one or more tension members 24 that are coupled to the support 2 and to the banner display 10 in order to support the banner display 10 from the support 2. In an example, each tension member 24 is a mechanical structure with a length in a vertical direction (e.g., up and down in FIGS. 1 and 2) that is substantially longer than its width in a horizontal or lateral direction, and that is capable of withstanding a substantial tensile force exerted between the banner display 10 and the support 2. Examples of tension members 24 that might be commonly used to support the banner display 10 to the support 2 include, but are not limited to, cables (such as steel cables), rods (such as metal rebar rods), chains, ropes, beams, or thin metal bars. In some examples, the material that the tension members 24 are made from and the physical shape that the tension members 24 take is not important so long as the tension members 24 can collectively support the banner display 10 and so long as the one or more tension members 24 can be connected to the banner display 10, such as by being connected to the one or more structural members 22. In an example, the tension members 24 comprise cables, such as metal cables, for example steel cables. For this reason, the tension members 24 will be referred to as cables 24 for the remainder of this description. However, a person of ordinary skill in the art will understand that other forms of tension members 24 can be used without varying from the scope of the present invention.

The display modules 12 are configured to display one or more of video, graphical, or textual information. For this reason, the display modules 12 may also be referred to herein as "video display modules" or "graphical display modules" and the banner display 10 may be referred to as a "video display" or a "graphical display." In an example, each display module 12 includes a plurality of light-emitting elements 26 coupled to a front face 28 of the display module 12. The light-emitting elements 26 are positioned on the front faces 28 of the display modules 12 and the light-emitting elements 26 are operated in such a way so that the display modules 12 display the video, graphical, or textual information to someone who is viewing the banner display 10.

The light-emitting elements 26 can be any type of light-emitting technology known or yet to be discovered for the display of visual information, such as video, graphical, or textual information. At the time of filing of the present application, light-emitting diodes (LEDs) are one of the most common light-emitting technologies in use for video or graphical displays of the type described herein. As such, for the sake of brevity, the light-emitting elements 26 will be referred to as LEDs 26 throughout the present disclosure. However, it will be understood that any time the following description uses the term "light-emitting diode" or "LED," that light-emitting devices other than LEDs can be used, including, but not limited to, liquid crystal display devices (LCDs), organic light-emitting diodes (OLEDs), organic light-emitting transistors (OLETs), surface-conduction electron-emitter display devices (SEDs), field-emission display devices (FEDs), laser TV quantum dot liquid crystal display devices (QD-LCDs), quantum dot light-emitting diode display devices (QD-LEDs), ferro-liquid display devices (FLDs), and thick-film dielectric electroluminescent devices (TDELs).

In an example, the LEDs 26 are arranged into an array of pixels 30, e.g., with each pixel including one or more LEDs 26 grouped together in close proximity. The LEDs 26 and the pixels 30 are only shown on one display module 12 in FIGS. 1 and 2 and are omitted from the remaining display modules 12 so that other features of the banner display 10 is easier to discern. Also, the sizes of the pixels 30 and the LEDs 26 relative to the overall size of the banner display 10 are not necessarily shown on the scale However, a person of ordinary skill in the art will understand that all of the display modules 12 that make up the banner display 10 can include pixels 30 of LEDs 26 or that each LED 26 and/or pixel 30 can have a different size relative to the banner display 10.

In an example, multiple LEDs 26 are positioned together at each pixel 30. In some examples, the plurality of LEDs 26 include a plurality of different-colored LEDs 26 such that different-colored LEDs 26 of each pixel 30 can be cooperate to display what appears to be a spectrum of different colors for the viewer of the banner display 10. In an example, each pixel 30 includes a red LED 26, a green LED 26, and a blue LED 26, wherein the red, green, and blue LEDs of each pixel 30 cooperate to provide essentially the entire color spectrum that is visible to humans based on whether one, two, or all three of the LEDs 26 in a pixel 30 are lit and at what intensities. The front face 28 of the display module 12 can also provide a black or empty looking surface over a portion of the display, when desired, by deactivating or turning off the LEDs in one or more pixels 30 corresponding to that portion of the front face 28.

In an example, the plurality of display modules 12 are mounted to the mounting structure 20 such that adjacent display modules 12 are in close proximity to one other and the plurality of display modules 12 are operated together in such a way as to display the video, graphical, or textual information in a cohesive manner so that the entire banner display 10 appears to a viewer as a single display that is larger than the individual display modules 12. In an example, the pixels 30 are arranged in a grid-like array, such as a grid comprising a specified number of rows and a specified number of columns of the pixels 30. The banner display 10 can be controlled, for example with control software and/or one or more hardware controllers, so that visual information, e.g., video, graphical, or textual information, is broken down into coordinates. Each coordinate can correspond to a specific pixel location within the overall banner display 10, and the control software and/or the one or more hardware controllers can operate each pixel according to a program that specifies a condition for each coordinate within the image and controls each of the pixels 30 so that it will appear to emit light that meets condition specified. For example, if the banner display 10 is displaying a video or animation, the control software and/or the one or more hardware controllers can be fed the data corresponding to the video or animation, and the control software and/or the one or more hardware controllers can break the video or animation data down into conditions for each pixel 30, such as the time within the video or animation, the color that a pixel 30 is to display at that time and the intensity of the pixel 30 at that time. The control software and/or the one or more hardware controllers can also convert the information regarding color and intensity into specific operating parameters for each LED 26 in a particular pixel 30, such as the power that will be supplied to the red LED 26, the blue LED 26, and the green LED 26 in that pixel 30 and for how long in order to achieve the specified color and intensity at the specified time. The control software and/or the one or more hardware controllers can then send control signals to the pixels 30 or to individual LEDs 26 that can operate the pixels 30 according to the video or animation. Although a grid or grid-like array of LED pixels, as summarized above, is common for video banner displays, the banner display 10 described herein can use other arrangements of the LEDs 26 or other systems for addressing the LEDs 26 can be used without varying from the scope of the present invention.

In an example, the banner display 10 is configured so that visual information can be displayed from more than one side of the banner display 10. The example banner display 10 shown in FIG. 1 includes a first display surface 32 on a first, or front, side of the banner display 10 and an opposing second display surface 34 on a second, or rear, side of the banner display 10. For this reason, the first display surface will be referred to as the "front display surface 32" and the second display surface 34 will be referred to as the "rear display surface 34." In the example shown in FIGS. 1 and 2, the front display surface 32 and the rear display surface 34 are substantially identical, with the only difference being that the front display surface 32 and the rear display surface 34 are generally facing in opposing directions. Both display surfaces 32, 34 include a plurality of display modules 12 arranged in a close arrangement, as described above, so that LEDs on the front display surface 32 and the rear display surface 34 (such as the LEDs 26 shown in FIG. 1) can be operated together to display visual information on the display surfaces 32, 34.

Because the banner display 10 is being hung from the support 2 by the one or more cables 24, it is advantageous for the overall weight of the banner display 10 to be reduced as much as is possible so that the banner display 10 does not exceed the weight limit that the support 2 or the cables 24 are capable of carrying. For example, in some applications, the banner display 10 is configured to hang from a ceiling of a public place, such as a shopping mall or train station, such that people will be walking under the banner display 10 regularly. For this reason, it is desirable for the manufacturer of the banner display 10 to make each of the components of the banner display 10 to be as light as possible so that the overall weight of the banner display 10 is lower than a typical weight specification for a ceiling structure, and preferably much lower than the weight specification. Some manufacturers have attempted to achieve the goal of reduced weight by removing structures from the support cabinet to which the display modules are mounted. However, the reduced-weight support cabinets tend to have less structural integrity or are less visually appealing. In particular, because the banner displays described in the present disclosure are designed to hang from a support structure, this removal of structures or material from the support cabinet, and the corresponding reduction in structural integrity, can allow gravity to more easily pull the display modules apart, resulting in the formation of undesirable and prominent visual seams.

As noted above, the display modules 12 of the front display surface 32 and the rear display surface 34 are mounted onto the mounting structure 20. The mounting structure 20 of the present disclosure is particularly designed and adapted to allow for a reduced and more optimized weight for the banner display 10 while still providing sufficient structural integrity to support the display modules 12 and minimize the appearance of visual seams in the display surfaces 32, 34.

As is also noted above, the mounting structure 20 is made up of one or more structural members 22 that support the display modules 12. The one or more structural members 22 provide one or more structures for the display modules 12 to be mounted to and one or more structures for connection to the one or more cables 24. In some examples, the support structure 20 comprises a single structural member 22 that provides one or more connection points for each of the display modules 12 in the banner display 10 and one or more connection points for each cable 24.

In some other examples, the support structure 20 comprises a plurality of structural members 22, with each structural member providing connection points for a subset of all the display modules 12 that make up the banner display 10. In examples with a plurality of structural members 22, the cable or cables 24 may be connected to only one of the structural members 22, or the cables 24 may be connected to two or more of the structural members 22. In some examples with a plurality of structural members 22, the structural members 22 are generally aligned in a common plan (i.e., the structural members 22 can be coplanar or substantially coplanar to form a planar or substantially planar overall mounting structure). In some examples, each of the plurality of structural members 22 can be connected to another of the plurality of structural members 22 with one or more fasteners and/or one or more joining structures (not shown) to maintain positioning of the structural members 22 relative to one another.

In an example, the display modules 12 of the front display surface 32 can be mounted onto a first face 36, or front face 36, of the structural member 22 (or onto the front faces 36 if there are a plurality of structural members 22), while the display modules 12 of the rear display surface 34 can be mounted onto a second face 38, or rear face 38, of the structural member 22 (or onto the rear faces 38 if there are a plurality of structural members 22). In an example, the display modules 12 are mounted to the one or more structural members 22 with a plurality of fasteners 40, such as a first set of fasteners 40 that mount each of the display modules 12 on the front display surface 32 and a second set of fasteners 40 that mount each of the display modules 12 on the rear display surface 34. The fasteners 40 can be spaced at regular intervals and positioned at specified positions relative to the mounting structure 20 and the display modules 12 to provide substantially uniform support of each of the display modules 12 of the banner display 10.

In the example shown in FIGS. 1 and 2, the fasteners 40 are pins or threaded rods that connect the display modules 12 to the mounting structure 20, such as those present on bolts or screws, that engage a corresponding threaded feature of the mounting structure 20, the display module 12, or both. Other forms of fasteners can be used without varying from the scope of the present invention, such as stables, nails, brads, or any other fastener capable of coupling a display module 12 to the mounting structure 20 (either permanently, semi-permanently, or temporarily). In other examples, a "fastener," as that term is conventionally understood, may not be used at all. For example, the display modules 12 can be coupled to the mounting structure 20 by welding, adhering with an adhesive, clamping, or otherwise connecting the display modules 12 to the mounting structure 20. A specific example of alternative fastening or mounting structures other than a conventional fastener is described below with respect to FIGS. 5-8.

In an example, the one or more structural members 22 are made from relatively light-weight materials, or that have a relatively low profile, or both. As used herein, the term "low profile," when referring to the mounting structure 20, is a mounting structure 20 with a relatively small size, particularly in a lateral thickness dimension, compared to more conventional support cabinet that are made from a frame onto which display modules are mounted. For example, as shown in FIGS. 1 and 2, the mounting structure 20 (and, therefore, each of the one or more structural members 22 that form it) can be a substantially planar mounting structure 20 with a relatively small thickness T, for example a thickness T of about 2.5 inches or less (e.g., about 6.5 centimeters (cm) or less), such as about 2 inches or less (e.g., about 5 cm or less), for example about 1.5 inches (e.g., about 4 cm or less), such as about 1 inch or less (e.g., about 2.5 cm or less); for example about 0.75 inches or less (e.g., about 2 cm or less); and in some examples as little as 0.5 inches or less (e.g., as little as 1.25 cm or less). While the mounting structure 20 and each of the one or more structural members 22 are made from a relatively light-weight material, or have a relatively low profile, or both, in some examples, they still provide one or more of: sufficient mechanical strength (i.e., tension strength, compression strength, or both) to support the display modules 12; sufficient durability to last during the specified life span of the banner display 10; and sufficient rigidity so that the mounting structure 20 does not deform during use of the banner display 10. One relatively light-weight material that may be advantageously used as the one or more structural members 22 of the mounting structure 20 is aluminum.

Composite Support Members

In an example, each of the one or more structural members 22 is made from a composite material that is constructed to provide for one or more of these material properties. As used herein, the term "composite material" refers to a structure that comprising more than one component that work together to provide for one or more improved properties of the overall composite material compared to the same one or more properties in each of the components that make up the composite material. As used herein, the terms "component" or "components," when referring to a components of a composite material, refer to different materials or different types of materials that are combined to form the composite material or can refer to different physical structures that might be made of the same material or type of material and are combined in close physical proximity to form the composite material. In some examples, the components of the composite material can cooperate in a synergistic manner. For example, a first component of the composite material can possess one or more desired first properties (e.g., a desired value for one or more first mechanical properties) and a second component of the composite material can possess one or more desired second properties (e.g., a desired value for one or more second mechanical properties). But, by itself, the first component might not possess a sufficient value with respect to the one or more second properties (e.g., the first component might have too high or too low of a value with respect to a second mechanical property). Similarly, by itself, the second component might not possess a sufficient value with respect to the one or more first properties (e.g., the second component might have too high or too low of a value with respect to a first mechanical property). In some examples, however, when the first component and the second component are combined, the resulting composite material can have values of the one or more first properties that are acceptable because of the presence of the first component (even though the second component, by itself, does not) and can have values of the one or more second properties that are acceptable because of the presence of the second component (even though the first component, by itself, does not). In this way, the components of the composite material can, in some examples, contribute to the overall composite material being within a desired specification with respect to several specific properties (such as two or more mechanical properties).

Because the one or more structural members 22 are, in some examples, made from a composite material, the one or more structural members 22 of the mounting structure 20 will also be referred to herein as one or more "composite members 22." It will be understood that in instances where a structure is referred to as a "composite member" (whether referring specifically to the composite members 22 or to another composite member) that it may be possible in other embodiments to use a structural member that is not made from a composite material without varying from the scope of the present invention.

In some examples, the components that make up a composite member 22 are made from one or more light-weight materials that are structurally configured so that, overall, the composite member 22 will possess sufficient tensile strength in the vertical direction V (FIG. 2) to support the weight of the banner display 10 because the weight of the banner display 10, and in particular the display modules 12, will be pulled by gravity in the vertical direction V. The components that make up the composite member 22 can also be selected and structurally configured to provide sufficient strength in a horizontal direction H (FIG. 2) so that the composite member 22 can hold at least a portion of the weight of a display module 12 at an individual point on the composite member 22 without breaking down so that a display module 12 that is mounted to the composite member 22 will not pull away from the composite member 22.

In some examples, the components that make up the composite member 22 can also be selected and structurally configured to provide sufficient rigidity to the composite member 22 and the overall mounting structure 20 (if it is made from a plurality of composite members 22). As used herein, the term "rigidity" refers to resistance to bending or buckling by the composite member 22 and the overall mounting structure 20, and in particular resistance to any portion of the mounting structure 20 being moved out of alignment with the desired vertical or substantially vertical orientation of the banner display 10. As will be appreciated by a person of skill in the art, a structurally supporting member like the one or more composite members 22 of the mounting structure 20 can be subjected to bending or buckling due to non-uniform application of force on the supporting member. For example, force is exerted on the mounting structure 20 in the banner display 10 at the connection point between each of the one or more cables 24 and the mounting structure 20 (which acts vertically upward to counter the gravitational force exerted on the banner display 10), and at each connection point where each of the display modules 12 are mounted to the mounting structure 20 (which can pull both vertically downward due to the weight of each display module 12 being pulled downward by gravity, but can also have a component acting horizontally outward from the faces 36, 38 of the mounting structure 20). There can also various other relatively small forces exerted on the mounting structure 20, such as small torsional forces exerted on the mounting structure 20 by one or more fasteners that couple the cables 24 or the display modules 12 to the mounting structure 20, such as the fasteners 40. Each of these forces act on the mounting structure 20 at a relatively concentrated point (e.g., at or proximate to a specific connection point) and can act in multiple directions. In some examples, the composite members 22 and the overall mounting structure 20 is, in some examples, sufficiently rigid to resist bending or buckling from these various forces, while still allowing the mounting structure 20 (and the entirety of the banner display 10) to be sufficiently light.

Sandwich Panel Composite

Figure 4:
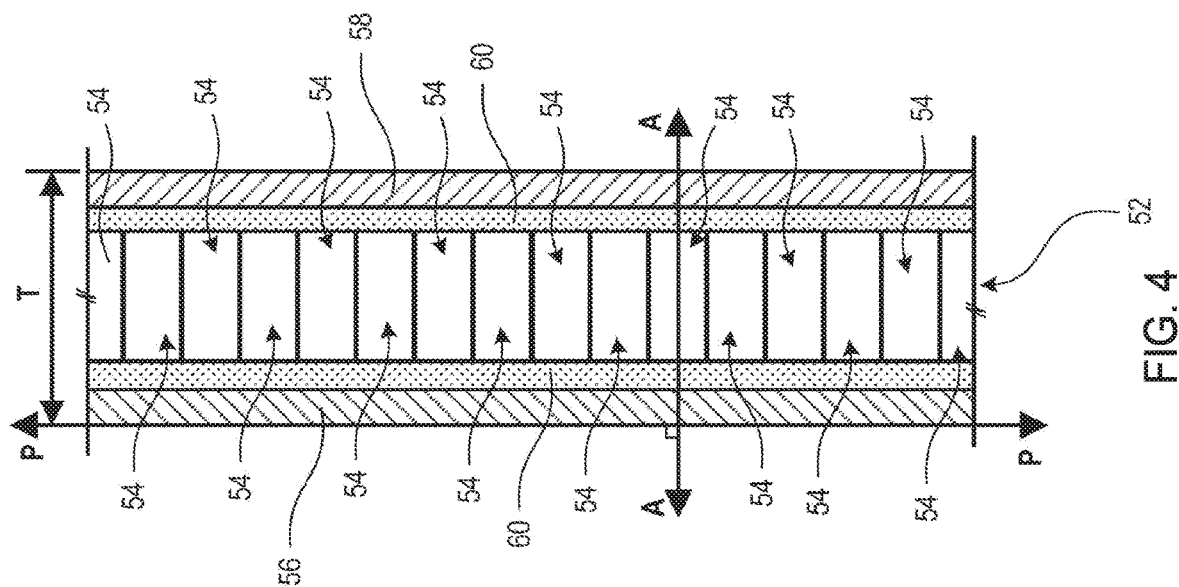
FIG. 4 is a cross-sectional side view of the example honeycomb composite sandwich panel of FIG. 3.
Figure 3:
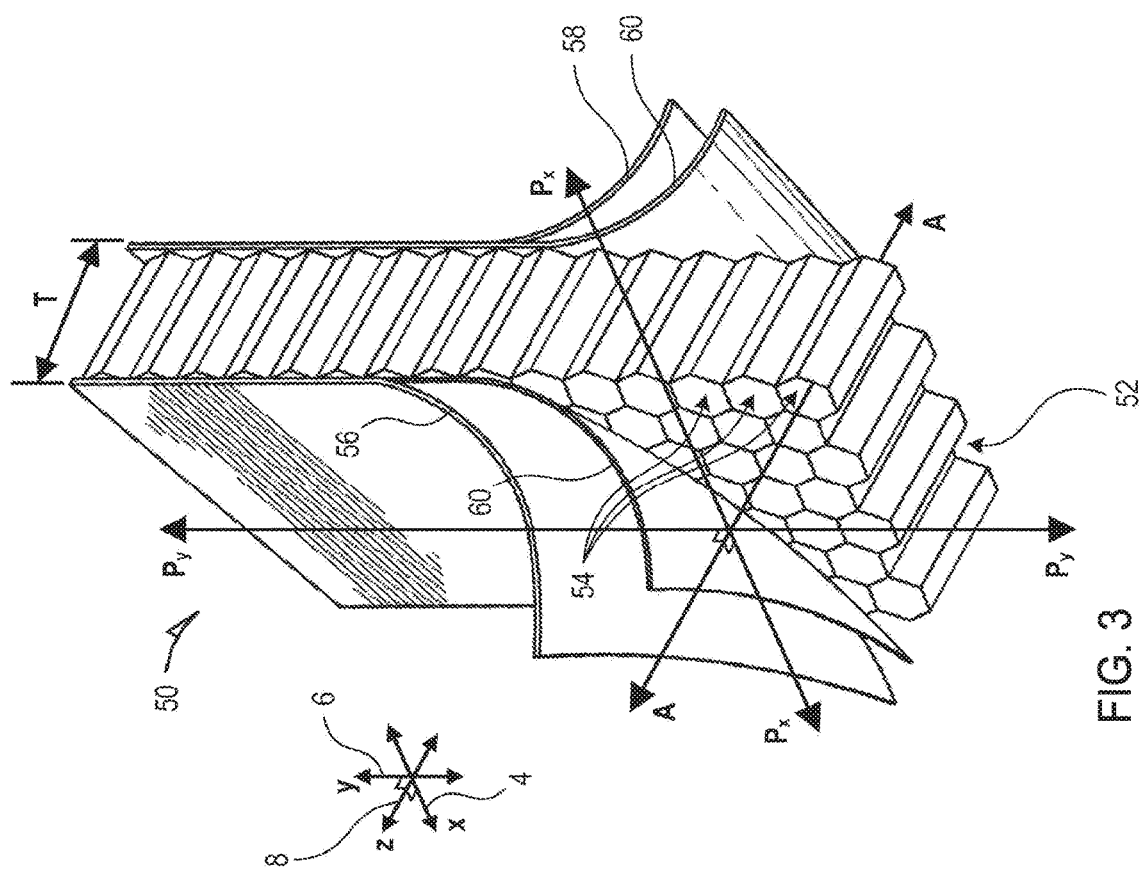
FIG. 3 is a partially peeled-away isometric view of an example honeycomb composite sandwich panel that can be used as a mounting structure in a banner display.

In an example, each of the one or more composite members 22 comprises a sandwich structure or sandwich panel. FIGS. 3 and 4 show an example sandwich panel 50 that can be used as one or more of the composite members 22 of the mounting structure 20 for the banner display 10 of FIGS. 1 and 2. In an example, the sandwich panel 50 comprises a core 52 that is formed from a plurality of generally cylindrical cells 54. A planar or substantially planar surface sheet is coupled onto each side of the core 52, for example a first surface sheet 56 coupled to a first face of the core 52 and a second surface sheet 58 coupled to a second face of the core 52. In an example, the first surface sheet 56 is parallel or substantially parallel to the second surface sheet 58.

The term "cylindrical," as used herein with respect to the cells 54, refers to a structure with a three-dimensional shape comprising the surface or surfaces generated by the movement of a straight line (i.e., a generatrix) tracing a planar two-dimensional cross-sectional shape (including, but not limited to, a circle, ellipse, square, rectangle, triangle, pentagon, and the like), wherein the generatrix remains at a fixed orientation relative to two end planes of the cylinder (such as the planes occupied by the surface sheets 56, 58) and the plane of the two-dimensional cross-sectional shape traced by the generatrix is parallel to one or both of the end planes or oblique to one or both of the end planes.

In an example, each surface sheet 56, 58 is coupled to the core 52 with an adhesive layer 60 disposed between the core 52 and a corresponding surface sheet 56, 58. However, other methods of coupling the surface sheets 56, 58 to the core 52 can be used, such as fasteners, welding, or clamping. FIG. 3 shows a partially "peeled away" isometric view of the sandwich panel, with a portion of the surface sheets 56, 58 and the adhesive layers 60 peeled away from the core 52 so that details of the cylindrical cells 54 can be seen. It will be understood, however, that in actual use the surface sheets 56, 58 and the adhesive layers 60 will not be peeled away, but rather substantially the entirety of each side of the core 52 is covered with and bonded to a corresponding surface sheet 56, 58, as shown in FIG. 4.

The surface sheets 56, 58 provide surfaces onto which the display modules can be mounted to form the display surfaces. For example, the first surface sheet 56 can provide a first face 62 for mounting display modules that will make up a first display surface and the second surface sheet 58 can provide a second face 64 for mounting display modules that will make up a second display surface. In other words, in an example, the first face 62 of the sandwich panel 50 can act as the front face 36 of the mounting structure 20 for display modules 12 of the front display surface 32 and the second face 64 can act as the rear face 38 of the mounting structure 20 for display modules 12 of the rear display surface 34. In an example, both the walls that form the cells 54 and the surface sheets 56, 58 are formed from a light and strong material, such as aluminum. In an example, both the walls of the cells 54 and the surface sheets 56, 58 comprise aluminum. In yet another example, both the walls of the cells 54 and the surface sheets 56, 58 include a main structural portion that consists of aluminum or consist essentially of aluminum (possibly with minor amounts of impurities or additives).

In an example, each of the generally cylindrical cells 54 of the core 52 extend in an axial direction A that is normal or substantially close to be normal relative to the plane P of the overall sandwich panel 50, as shown in FIG. 4. Put another way, the orientation of the sandwich panel 50 can be defined using rectilinear Cartesian coordinates, with the x- and y-directions being defined as the directions in which the planar or substantially planar sandwich panel 50 extends (which, in use, correspond to the horizontal direction H and the vertical direction V, respectively, described above with respect to FIGS. 1 and 2), and the z-direction being defined as the direction of the thickness dimension T of the sandwich panel 50, as demonstrated by the x-axis 4, y-axis 6, and z-axis 8 in FIG. 3. In this way, the plane of the sandwich panel 50 (labeled as plane P in FIG. 4) can be broken down into an x-component that extends in a direction that is parallel to the x-axis 4 (labeled as "$P_x$" in FIG. 3) and a y-component that is parallel to the y-axis 6 (labeled as "$P_y$" in FIG. 3). As shown in FIG. 3, the axial direction A of the cells 54 is perpendicular to both the x-component $P_x$ and the y-component $P_y$ of the plane of the sandwich panel 50 such that the axial direction A is substantially parallel to the z-axis 8.

In an example, the plurality of cells 54 form a regular geometric pattern that fits together in close proximity. For example, the example cells 54 shown in FIG. 3 each have a cross-sectional shape that is or substantially corresponds to a regular hexagon. The cells 54 can also be positioned so that the fill or cover a substantial surface area of the core 52, and in some examples substantially the entirety of the surface area of the core 52. The close-fitting proximity of the plurality of the cells 54 in combination with the cells 54 filling or covering a substantial portion of the surface area of the core 52 results in the cells 54 forming an overall pattern that resembles a honeycomb pattern, which is particularly apparent with the hexagonal or substantially hexagonal cells 54 depicted in the example shown in FIG. 3. For this reason, the cylindrical cells 54 may also be referred to as "honeycomb cells 54." Similarly, a core 52 that is formed from honeycomb cells 54 may also be referred to as a "honeycomb core 52." and a sandwich panel 50 formed from such a honeycomb core 52 may also be referred to as the "honeycomb sandwich panel 50."

The concept of a honeycomb structure for the cells 54 and the core 52 is not limited to the specific shape or arrangement of the cells 54 depicted in FIGS. 3 and 4. In other words, the honeycomb core 52 is not limited to hexagonal or substantially hexagonal cells 54. Moreover, the honeycomb core 52 is not limited to all the cells 54 being of substantially the same size or all being substantially the same shape. Rather, the cells 54 could have any cross-sectional shape or combination of shapes. As will be appreciated, there can be substantial variation in the shape or shapes of the cells 54, arrangement of the cells 54, and positioning of the cells 54 to form the honeycomb core 52, and that this variation can allow a skilled artisan to tailor the resulting mechanical properties of the honeycomb core 52 and the overall honeycomb sandwich panel 50 to the particular specifications of the banner display, display modules, support, and application.

The honeycomb core 52 and the surface sheets 56, 58 can work together to provide for structural integrity in multiple directions within the honeycomb sandwich panel 50. For example, the honeycomb cells 54 provide for substantial strength in the axial direction A for each of the honeycomb cells 54. As described above, the axial direction A is parallel to the z-axis 8 of the honeycomb sandwich panel 50. The combination of the honeycomb structure of the cells 54 and the arrangement of the cells 54 in close proximity and throughout substantially the entire surface area of the honeycomb core 52 results in the honeycomb sandwich panel 50 having a high rigidity or stiffness in the z-direction. Also, the combination of the honeycomb cells 54 being oriented to be substantially perpendicular to the direction of the plane P of the honeycomb sandwich panel 50, along with the surface sheets 56, 58 being planar or substantially planar in the direction of the plane P results in the plurality of honeycomb cells 54 and the surface sheets 56, 58 providing substantial tensile strength in the x-direction and in the y-direction, which corresponds to the vertical direction V when the honeycomb sandwich panel 50 is used to form the one or more composite members 22 of the mounting structure 20 (see FIG. 2). The substantial tensile strength in the y-direction or the x-direction can also prevent or minimize deformation of the honeycomb sandwich panel 50 in either direction due to gravitational pull, e.g., from gravity acting on the display modules over time, such that the honeycomb sandwich panel 50 can also reduce the likelihood of visual seam formation between adjacent display modules mounted to the honeycomb sandwich panel 50. Moreover, because both the honeycomb core 52 and the surface sheets 56, 58 can be made from a relatively light material such as aluminum, this high level of rigidity, tensile strength, and minimized deformation can be achieved with a mounting structure that has a weight that is much lower than conventional framed support cabinets, particularly steel support cabinets, while still offering better performance than the framed support cabinets.

Returning to FIGS. 2 and 3, in an example where a honeycomb sandwich panel 50 is used to form the one or more composite members 22 of the mounting structure 20, the honeycomb sandwich panel 50 can be a stock honeycomb sandwich structure that is manufactured in bulk by a panel manufacturer. The manufacturer of the banner display 10 can then modify the stock honeycomb sandwich panel 50, such as by cutting the stock honeycomb sandwich panel 50 to the specified shape, such as the shape of the mounting structure 20 that is best seen in FIG. 1. The stock honeycomb sandwich panel 50 can also be modified by cutting or punching one or more holes through the stock honeycomb sandwich panel, such as one or more fastener holes 66 that each receive and engage with the fasteners 40 or to which a receiving structure can be mounted to the mounting structure 20 wherein the receiving structure can receive and engages with the fastener 40 (such as a nut or nut-like structure that is received or held within a fastener hole 66, where the nut or nut-like structure threadingly engages a bolt-like fastener 40). One or more openings can also be cut into an interior position of the stock honeycomb sandwich panel that will form the mounting structure 20, such as the one or more openings 68 in the mounting structure 20 that are sized and positioned to receive one or more electrical components 70 of a display module 12 (best seen in FIG. 2). The electrical components 70 can be, for example, the supporting electronics for driving or controlling the LEDs 26 of the display modules 12 to display one or more of video, graphical or textual information on one or more of the display surfaces 32, 34.

As shown in FIGS. 1 and 2, the display modules 12 and their electrical components 70 can be positioned in close proximity to the mounting structure 20. In examples where the one or more composite members 22 that form the mounting structure 20 are made from aluminum, this close proximity can allow the mounting structure 20 to act as a heat sink or heat conduit through which heat generated by the electrical components 70 due to operation of the display modules 12 can flow in order to maintain a specified operating temperature for the electrical components 70. As will be appreciated, aluminum is a metal and, therefore, is relatively good at conducting heat. This can also allow an active cooler to be placed somewhere else on or in the banner display 10 and in a position to cool the mounting structure 20, which in turn can cool the electrical components 70 via heat conduction through the mounting structure 20, rather than having to position the cooler proximate to the electrical components 70.

Magnetic Mounting

Figure 5:
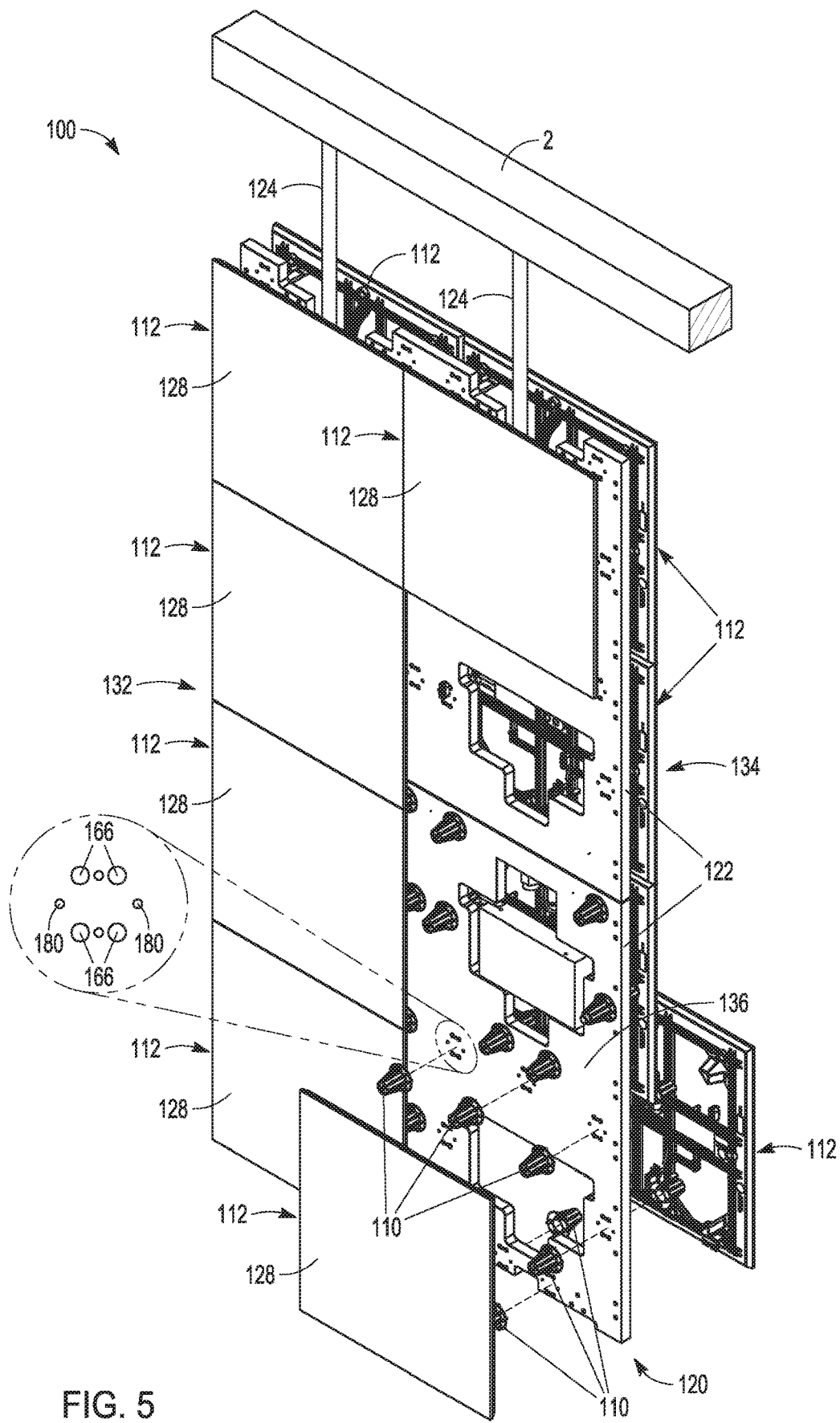
FIG. 5 is a partially exploded isometric view of a second example banner display for the display of visual information.
Figure 6:
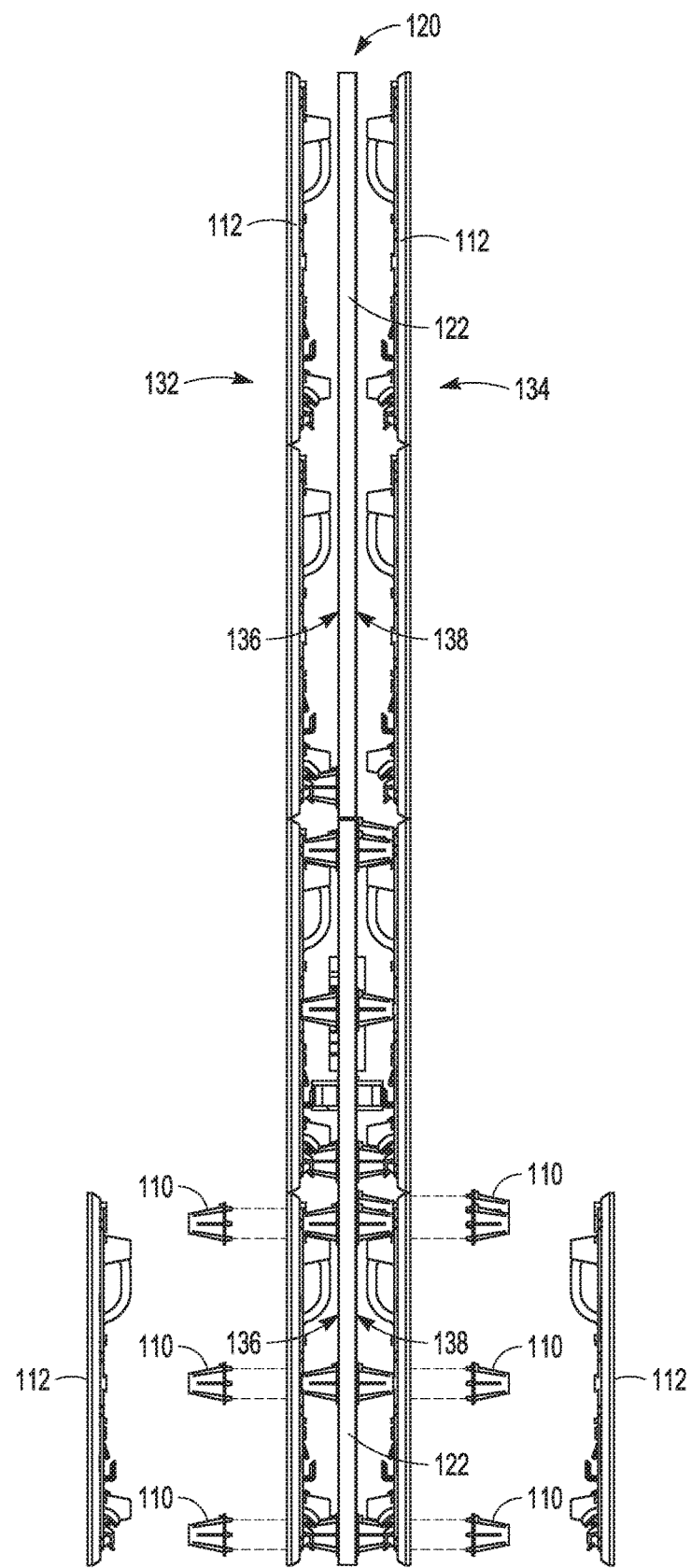
FIG. 6 is a cross-sectional side view of the example banner display of FIG. 5.

As described above with respect to FIGS. 1 and 2, the display modules 12 that make up the banner display 10 can be coupled or otherwise mounted to the mounting structure 20 (i.e., to the one or more structural members 22) with one or more fasteners, such as the conventional fasteners 40 described above. FIGS. 5 and 6 show an example banner display 100 where display modules 112 are mounted to a mounting structure 120 using specialized magnetic mounts 110.

The structures or components that make up the banner display 100 of FIGS. 5 and 6 can be similar or identical to those of the banner display 10 of FIGS. 1 and 2 except for the use of the magnetic mounts 110 rather than more conventional fasteners 40, such as those shown in the example FIGS. 1 and 2. For this reason, components of the banner display 100 that can be similar or identical to the corresponding components of the banner display 10 described above will be given similar reference numbers.

The banner display 100 can be configured to be supported (i.e., hung) from a similar support 2. The mounting structure 120 can comprise one or more structural members 122 to support the weight of the display modules 112. In an example, one or more of the structural members 122 can comprise a composite structure, such as the composite sandwich panel 50 described with respect to FIGS. 3 and 4. The banner display 100 can be hung from the support 2 by one or more tension members 124, such as one or more cables 124.

In an example, each display module 112 includes a plurality of light-emitting elements, such as the LEDs 26 or other light-emitting elements 26 described above with respect to the banner display 10 of FIGS. 1 and 2. The light-emitting elements are coupled to front faces 128 of the display modules 112 and are operated in such a way so that the display modules 112 display one or more of video, graphical, or textual information from the banner display 100. The light-emitting elements can be arranged and operated in pixels, similar to the pixels 30 described above with respect to banner display 10. As with the banner display 10 shown in FIGS. 1 and 2, the example banner display 100 of FIGS. 5 and 6 is configured to show visual information in more than one direction from the banner display 100. For example, the banner display 100 includes a first display surface 132 on a first side, or front side, and an opposing second display surface 134 on a second side, or rear side, referred to as the "front display surface 132" and the "rear display surface 134" (best seen in FIG. 6). The one or more structural members 122 can include a front face 136 onto which the display modules 112 of the front display surface 132 are mounted and a rear face 138 onto which the display modules 112 of the rear display surface 134 are mounted (best seen in FIG. 6).

Figure 7:
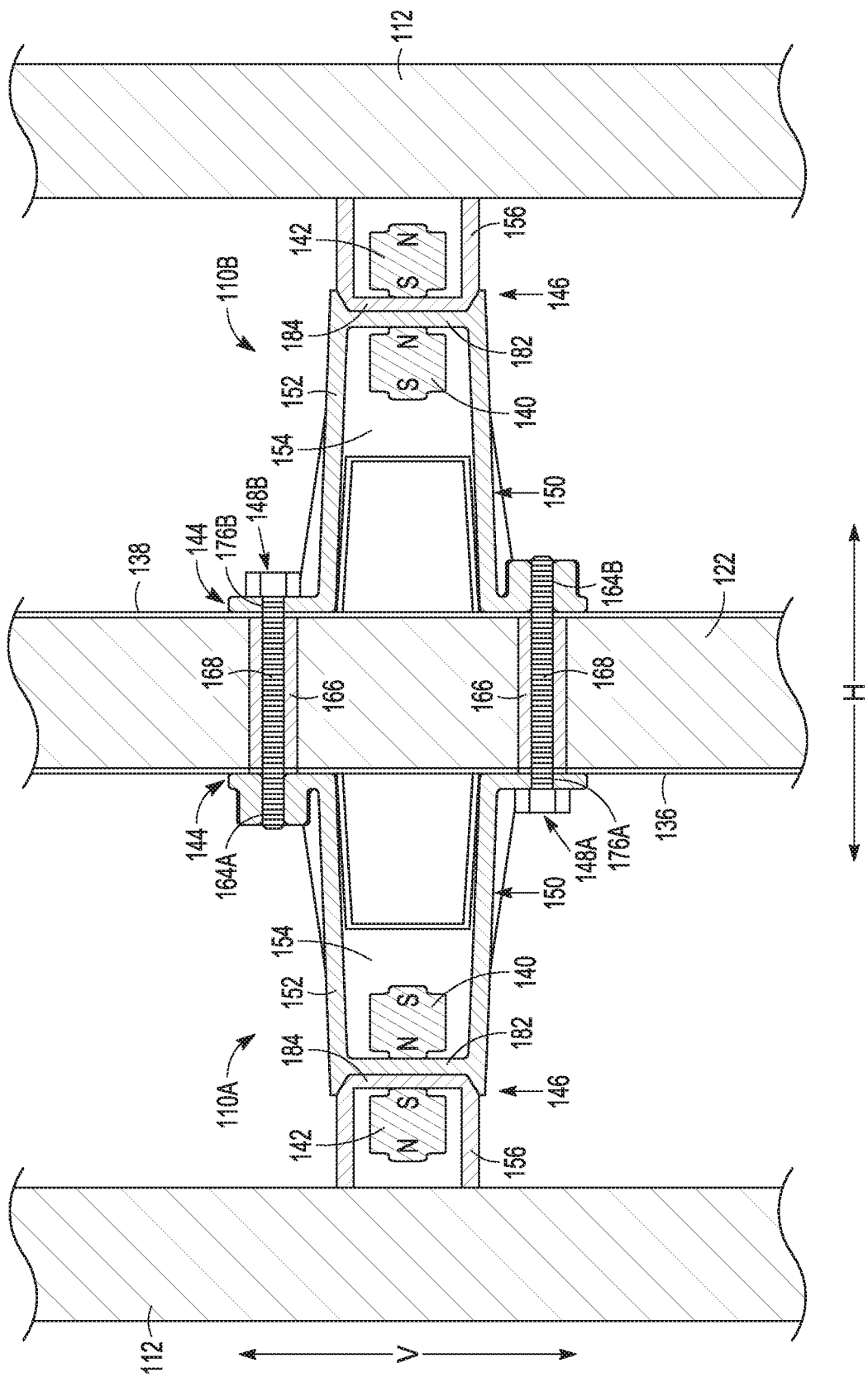
FIG. 7 is a close-up cross-sectional view of a pair of example magnetic mounts magnetically coupling display modules to a structural member in order to form the example banner display of FIG. 5.

As described above, the display modules 112 of the banner display 100 are magnetically mounted to mounting structure 120 (i.e., to one of the structural members 122) with a plurality of magnetic mounts 110. The magnetic mounts 110 use one or more magnets 140, 142 to magnetically couple the display modules 112 to the mounting structure 120 at one or more points of each display module 112. FIG. 7 shows a close-up cross-sectional view of an example magnetic mount 110 in use to magnetically mount a display module 112 to a corresponding structural member 122. Each magnetic mount 110 uses a mounting magnet 140 and a corresponding mating magnetic structure 142 to magnetically couple the magnetic mount 110 to another structure. As used herein, the term "mating magnetic structure" refers to a structure comprising at least one material that can be magnetically engaged by the mounting magnet 140 in order to hold the display module 112 to the structural member 122. As used herein. "magnetically engage" and similar terms such as "magnetic engagement" refer to a magnetic attraction force being formed between the mounting magnet 140 and the mating magnetic structure 142 with sufficient magnitude that collectively the magnetic mounts 110 will hold the display module 112 in place relative to the mounting structure 120. In some examples, magnetic engagement between the mounting magnet 140 and the mating magnetic structure 142 is sufficient so that collectively the magnetic mounts 110 can support the weight of the display module 112 without the use of any additional fastening or coupling structures other than the magnetic engagement between the mounting magnets 140 and the mating magnetic structures 142.

As described in more detail below, in an example the mating magnetic structure 142 is a second magnet 142 (also referred to herein as a "mating magnet 142"). While examples are shown and described where the mating magnetic structure 142 is a magnet too, those of skill in the art will understand that a reference to the mating magnetic structure 142 will generally not be limited to magnetic materials, but can also refer to other magnetizable materials that can form the magnetic engagement with the mounting magnet 140. For example, the mating magnetic structure 142 can be a non-magnetic but magnetizable material, such as a magnetizable metal or a composite material including a magnetizable metal. In such an example, the magnetizable material of the mating magnetic structure 142 is capable of being magnetized by the mounting magnet 140 so that the magnetic attraction force can be formed between the mounting magnet 140 and the magnetizable material of the mating magnetic structure 142.

In the example shown in FIG. 7, the mounting magnet 140 is included as part of the magnetic mount 110 itself and the mating magnetic structure 142 is coupled to the structure that magnetically engages the magnetic mount 110, such as the display module 112 in FIG. 7. Alternatively, the mating magnetic structure 142 can be incorporated as part of the magnetic mount 110 and the mounting magnet 140 can be coupled to the structure that magnetically engages the magnetic mount 110.

In an example, each magnetic mount 110 includes a first end 144 and a generally opposed second end 146. For example, as shown in FIG. 7, the magnetic mount 110 can have a length in one direction (i.e., the horizontal direction H in FIG. 7) that is longer than its width in a perpendicular direction (i.e., in the vertical direction V in FIG. 7), such that the first end 144 and the second end 146 are on generally opposite sides of the magnetic mount 110 in its length direction. In the example shown in FIG. 7, the magnetic mount 110 is fastened or otherwise physically coupled to a corresponding face 136, 138 of the structural member 122, such as with one or more fasteners 148 (i.e., one or more bolts or screws) that are inserted through a hole or other fastener mating structure in the structural member 122. When the first end 144 is fastened to the structural member 122, the magnetic mount 110 protrudes laterally away from the face 136, 138 in the horizontal direction H out to its second end 146. For this reason, the first end 144 of the magnetic mount 110 will also be referred to herein as the "proximal end 144" or the "fastening end 144," and the second end 146 will also be referred to as the "distal end 146" or the "magnetic-mounting end 146" (or simply the "mounting end 146").

As noted above, in the example shown in FIG. 7, the mounting magnet 140 is incorporated in the magnetic mount 110, such as by being located at or proximate to the magnetic-mounting end 146. In an example, the magnetic mount 110 includes a body 150 formed from a body material. For example, the body 150 can be formed by molding a polymer, such as a polycarbonate, into the desired geometry. In an example, the body 150 includes a wall 152 surrounding a hollow cavity 154. In an example, the body 150 is shaped and sized so that the cavity 154 is large enough to receive the mounting magnet 140 therein. In an example, the size and shape of the cavity 154 are selected such that the mounting magnet 140 can move within the cavity 154. i.e., so that the mounting magnet 140 is not fastened to the body 150. In an example, the size and shape of the cavity 154 are selected such that the mounting magnet 140 can rotate, flip, or otherwise change its orientation within the cavity 154 so that that a polarity orientation of the mounting magnet 140 can changed. In such an example, the mounting magnet 140 will be able to change the polarity that is dominant at the mounting end 146. For example, if the polarity of the corresponding mating magnet 142 does not properly match the current orientation of the mounting magnet 140 (i.e., if the same pole for the mating magnet 142 is pointing toward the mounting magnet 140, either both north poles or both south poles), then the mounting magnet 140 may be unable to properly magnetically engage with the mating magnetic structure 142. However, if the cavity 154 is large enough and shaped such that the mounting magnet 140 can change its orientation enough to change its dominant polarity, i.e., by flipping or inverting its orientation, then the mounting magnet 140 can move or be moved to properly orient it for magnetic engagement.

Because the mounting magnet 140 is included in the magnetic mount 110 in the example shown in FIG. 7, the mating magnetic structure 142 (i.e., the mating magnet 142) is located at or within a mating structure 156 coupled to the structure that is to be magnetically engaged by the mounting magnet 140 (i.e., a corresponding display module 112 in FIG. 7). However, it will be appreciated that the location of the mounting magnet 140 and the mating structure 142 can be reversed. i.e., with the mounting magnet 140 being located at or in the mating structure 156 and the mating magnetic structure 142 being located at or proximate to the mounting end 146 of the magnetic mount 110. In examples where the mating magnetic structure 142 is a magnet, and in particular in examples where the mounting magnet 140 and the mating magnet 142 are substantially the same, there may not be any practical difference between the mounting magnet 140 being located in the magnetic mount 110 and the mating magnet 142 being located in the mating structure 156 or vice versa. However, when the mating structure 142 is a non-magnetic structure or is a mating magnet 142 that is different from the mounting magnet 140 (either in size or magnetic material makeup), then having the mounting magnet 140 located in the magnetic mount 110 might have a different practical effect than if it is located in the mating structure 156. In any event, those of skill in the art will appreciate that the magnetic mounting described herein can be accomplished via either configuration (i.e., with the mounting magnet 140 in the magnetic mount 110 or in the mating structure 156), and neither configuration is excluded from the scope of the present disclosure.

FIGS. 8A-8H show several views of an example body 150 of the magnetic mount 110, which show several features that can be included with the magnetic mount 110. As shown in FIGS. 8A-8H, in an example, the magnetic mount 110 comprises an elongated body 150 having a length L that is longer than the width W at the mounting end 146. In an example, the length L of the body 150 is at least about twice as much as the width W at the mounting end 146, and in some examples at least 2.5 times as much as the width W. The actual length L and width W used for the body 150 will depend on the dimensions of other components of the banner display 100, including the size of the electrical components of the display module 112 (which can be similar to the electrical components 70 if the display module 12 shown in FIG. 2). However, in an example, the length L of the body 150 is from about 25 millimeters (mm) to about 50 mm (about 1 inch to about 2 inches), such as from about 30 mm to about 45 mm (about 1.2 inches to about 1.75 inches), such as about 35 mm (about 1.38 inches), about 36 mm (about 1.41 inches), about 37 mm (about 1.46 inches), about 38 mm (about 1.5 inches), about 39 mm (about 1.54 inches), or about 40 mm (about 1.57 inches). In the same example, the width W of the body 150 at the mounting end 146 is from about 5 mm to about 25 mm (about 0.2 inches to about 1 inches), such as from about 10 mm to about 20 mm (about 0.4 inches to about 0.8 inches), for example about 11 mm (about 0.43 inches), about 12 mm (about 0.47 inches), about 13 mm (about 0.5 inches), about 14 mm (about 0.55 inches), about 15 mm (about 0.59 inches), or about 16 mm (about 0.63 inches).

The body 150 includes a main body portion 158 that extends between the proximal fastening end 144 and the distal mounting end 146. In an example the main body portion 158 has a frustoconical or generally frustoconical shape that is slightly wider at the proximal fastening end 144 that it is at the distal mounting end 146, best seen in FIGS. 8A and 8B. The frustoconical shape of the main body portion 158 can be formed with a portion of the wall 152 of the body 150 having a frustoconical or generally frustoconical profile, as shown in FIG. 8F. However, the magnetic mount body 150 is not necessarily limited to a frustoconical shape or to any other specific geometric shape, but rather the main portion 158 of the body 150 can have any specific or general geometric shape so long as the shape is capable of performing the functions described herein for the magnetic mount 110. Examples of the general geometric shapes that can be used to form all or a portion of the main body portion 158 include, but are not limited to: a frustoconical or generally frustoconical shape (such as that best seen in FIGS. 8A, 8D, 8E, and 8F); a cylindrical or generally cylindrical shape (e.g., a circular, ovular, or elliptical cylinder); or a polyhedral or generally polyhedral shape, such as a prism or generally prism shape (e.g., square, rectilinear, triangular, or higher order prisms), a pyramid or generally pyramidal shape (e.g., a pyramid with a triangular, square, rectangular, quadrilateral, or other polygonal base) or a frustum thereof, a segment a sphere, ellipsoid, or other curved shape, or any other regular, semi-regular, or non-regular polyhedral shape.

The body 150 can include one or more flanges 160 that extend radially outward at the proximal fastening end 144. i.e., at the wider end of the frustoconical main body portion 158. In an example, the one or more flanges 160 form an annular or generally annular shape that extends radially outward from the proximal fastening end 144, such as the single annular flange 160 best seen in FIGS. 8B-8D. The flange 160 provides a surface that be abutted up against the surface onto which the magnetic mount 110 is to be fastened (i.e., a structural member 122 in the banner display 100 shown in FIGS. 6 and 7), such as with the fasteners 148. The one or more flanges 160 can be formed so that a bottom surface 162 of the one or more flanges is aligned at a specified orientation relative to the main body portion 158 and relative to the mounting end 146. In an example, the bottom surface 162 is oriented to be normal or substantially normal to an axis $A_{MM}$ of the magnetic mount 110 so that when the one or more flanges 160 are abutted against the surface to which the body 150 is to be mounted, the body 150 (and thus the magnetic mount 110) will be perpendicular or substantially perpendicular to the surface to which the body 150 is mounted.

The one or more flanges 160 include one or more fastener holes 176 (best seen in FIGS. 8B-8E) that each pass axially through the flange 160 to receive a corresponding fastener 148 in order to fasten the fastening end 144 of the body 150 to another structure, such as the structural member 122. Each fastener hole 176 can be aligned with a corresponding fastener-receiving opening in the structure to which the magnetic mount 110 is being fastened. In the example shown in FIGS. 5-7, where the fastening ends 144 of the magnetic mounts 110 are each fastened to a corresponding structural member 122, there are a plurality of fastener-receiving openings 166 into each face 136, 138 of the structural member 122. In an example, each fastener-receiving opening 166 includes threading to threadingly engage with a threaded shaft 168 of one of the fasteners 148 in order to threadingly fasten the magnetic mount 110 to the structural member 122. At least a portion of each fastener hole 176 can also be threaded in order to engage with the threaded shaft 168.

The one or more fastener holes 176 described above are for receiving a fastener 148 from the same side of the structural member 122 that the magnetic mount 110 is on. For example, if the magnetic mount 110 in question is being fastened to the front face 136 of the structural member 122, than the fastener holes 176 on that magnetic mount 110 would receive fasteners 148 that are inserted on the front-face side of the structural member 122. However, in an example, the one or more flanges 160 can also include one or more fastener-end receiving holes 164 that can receive a distal end (e.g., a shaft tip) of a fastener 148 that had been inserted from the opposite side of the structural member 122 wherein the fastener shaft 168 was long enough to extend through the entire thickness of the structural member 122. For example, as best seen in FIG. 7, a fastener-end receiving hole 164 in the flange 160 of the magnetic mount 110 on the front face 136 can receive a distal shaft end of a fastener 148 that had been inserted from the side of the rear face 138, i.e., by first being inserted through the fastener hole 176 in the flange 160 of a magnetic mount 110 on the rear face 138. Similarly, a fastener-end receiving hole in the flange 160 of the magnetic mount 110 on the rear face 138 receives the distal shaft end of a fastener 148 inserted through the fastener hole 176 of the magnetic mount on the front face 136.

Figure 8A:
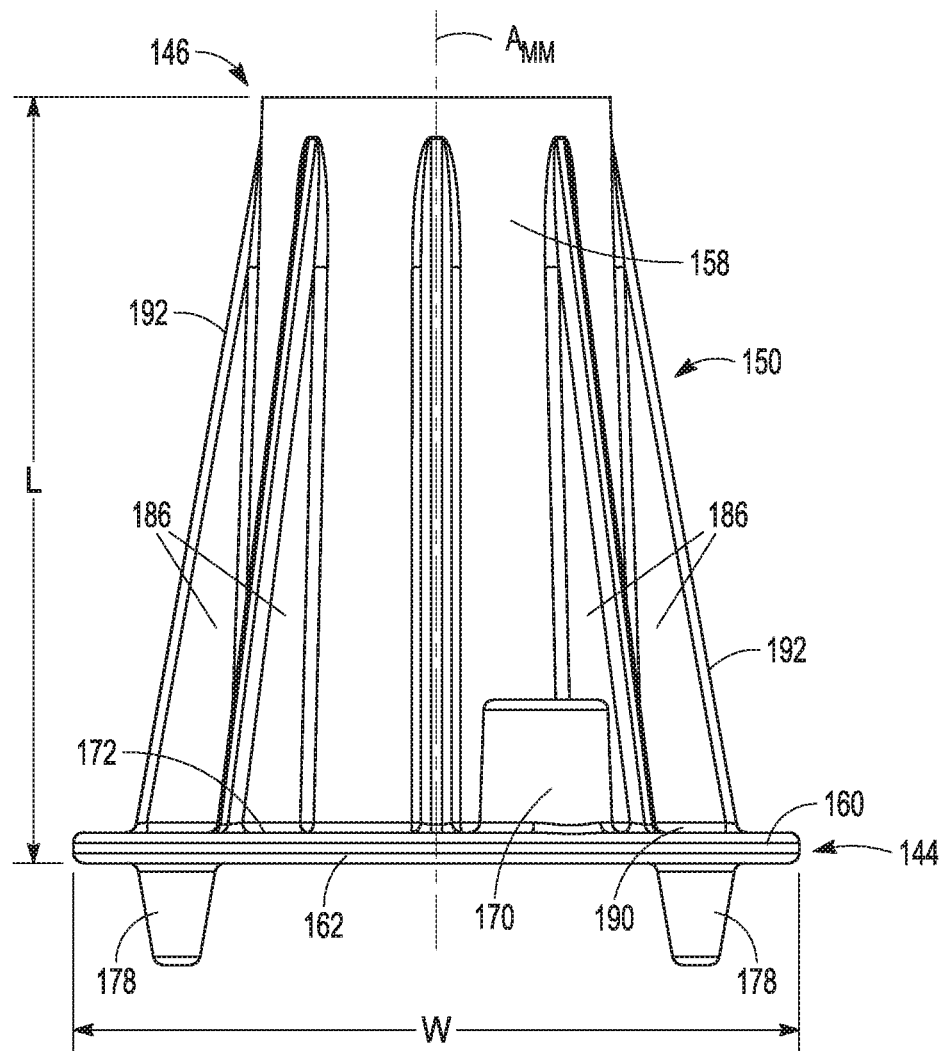
FIG. 8A is a side elevation view of an example magnetic mount body usable in the example banner display of FIG. 5.
Figure 8B:
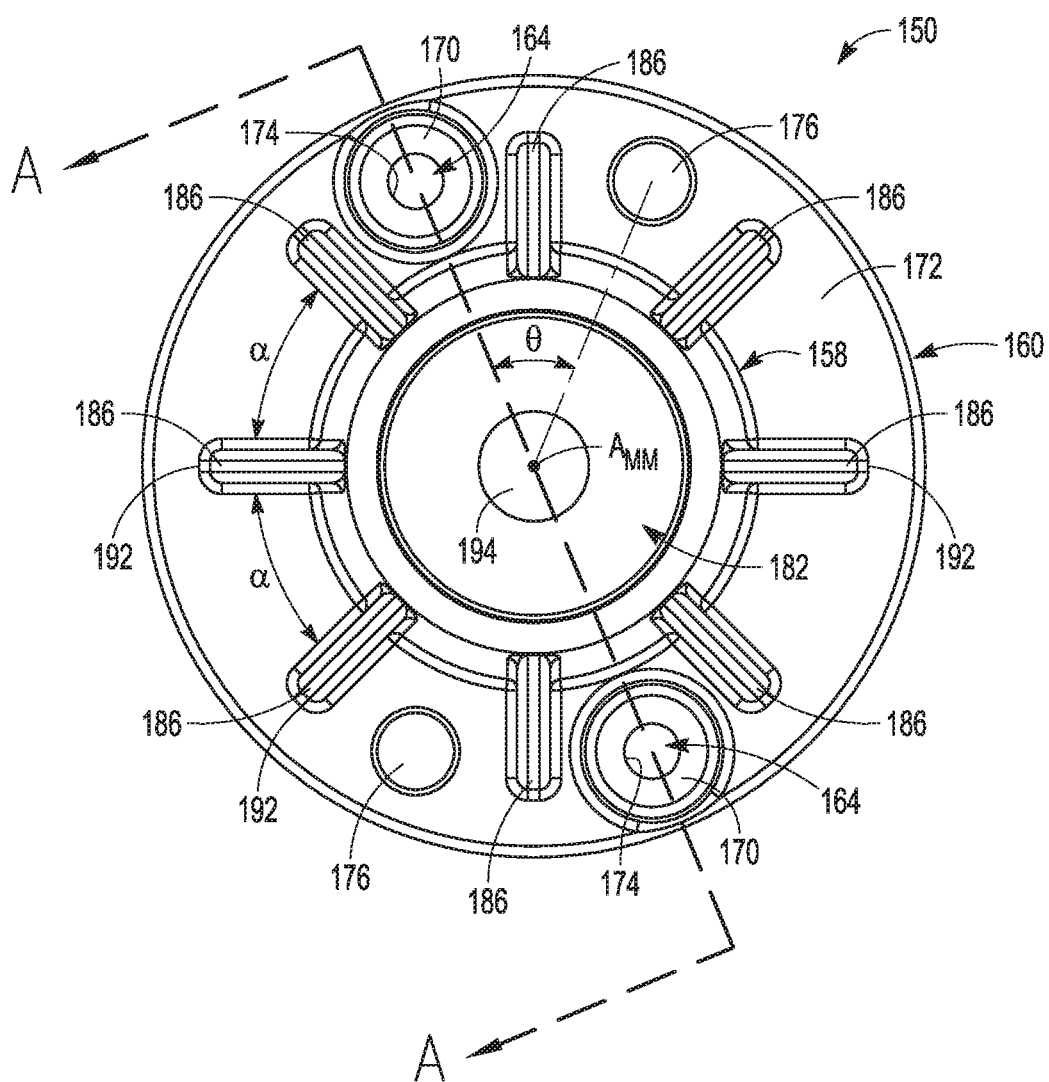
FIG. 8B is a top plan view of the example magnetic mount body of FIG. 8A.
Figure 8C:
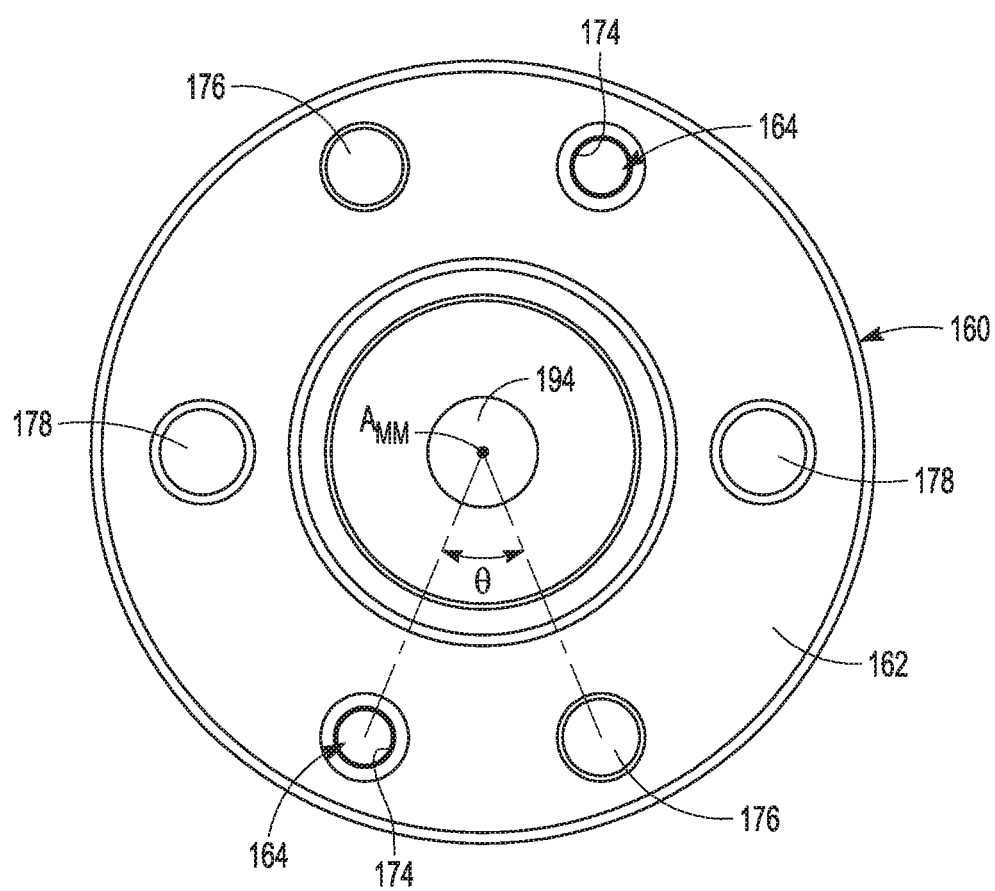
FIG. 8C is a bottom plan view of the example magnetic mount body of FIG. 8A.
Figure 8D:
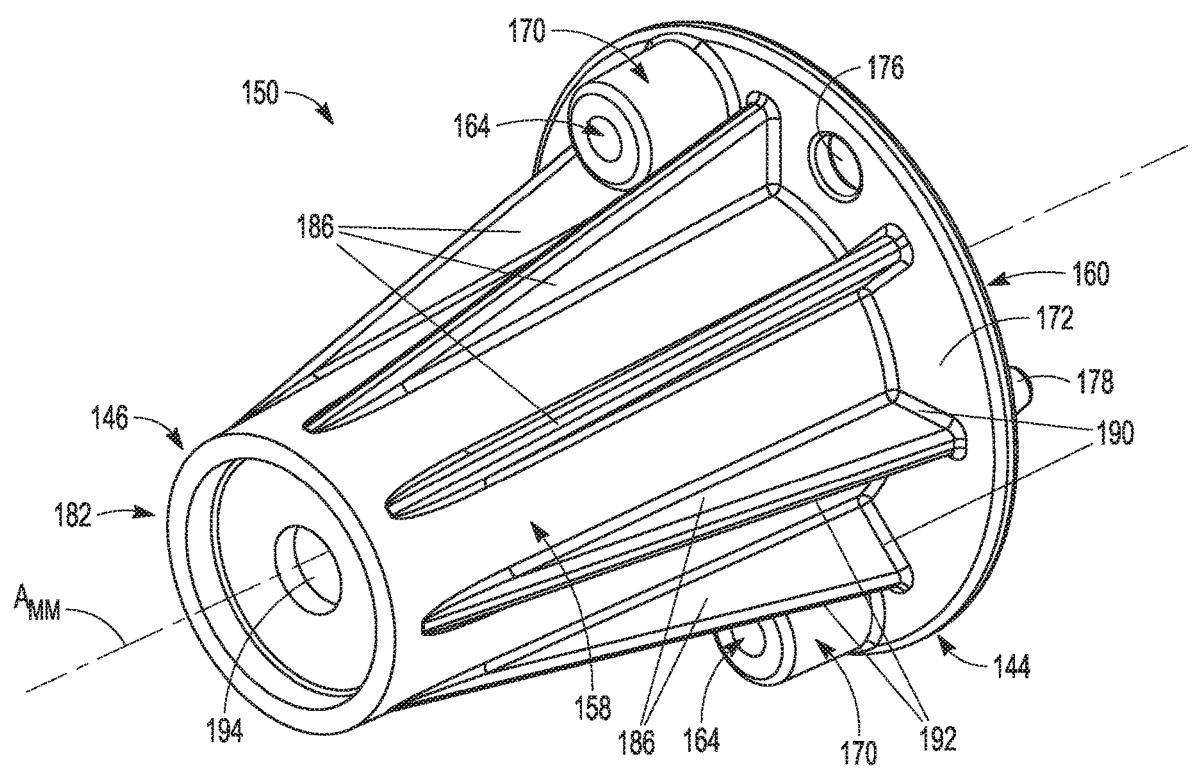
FIG. 8D is a rotated top perspective view of the example magnetic mount body of FIG. 8A.
Figure 8E:
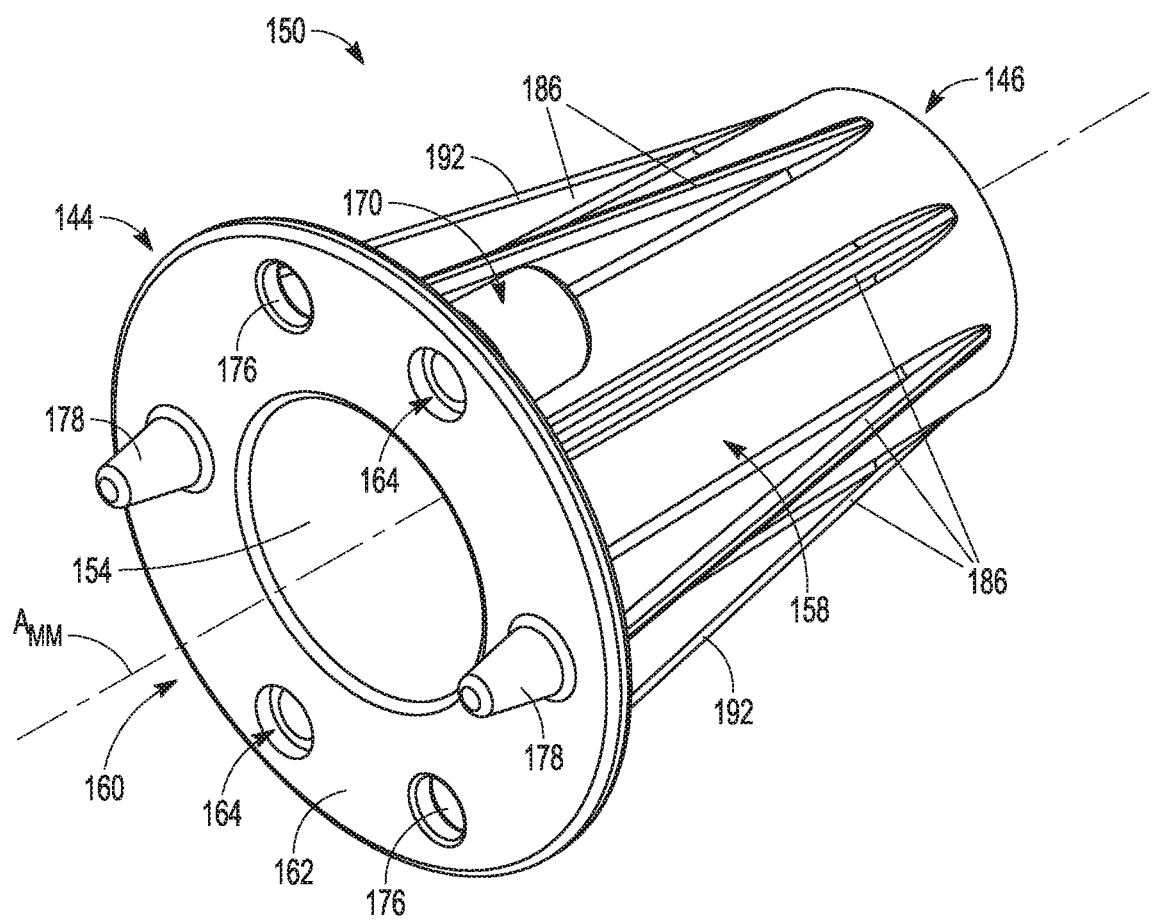
FIG. 8E is a rotated bottom perspective view of the example magnetic mount body of FIG. 8A.
Figure 8F:
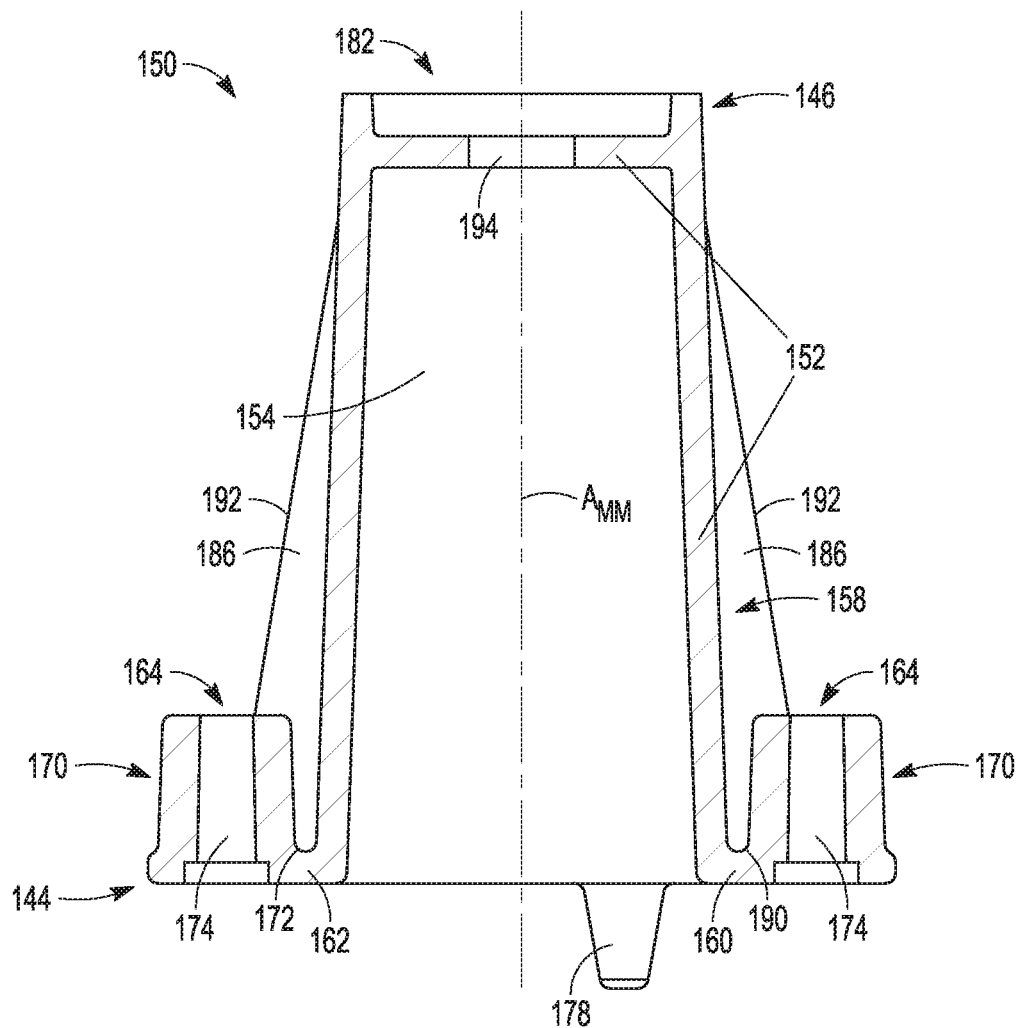
FIG. 8F is a side cross-sectional view of the example magnetic mount body of FIG. 8A.
Figure 8G:
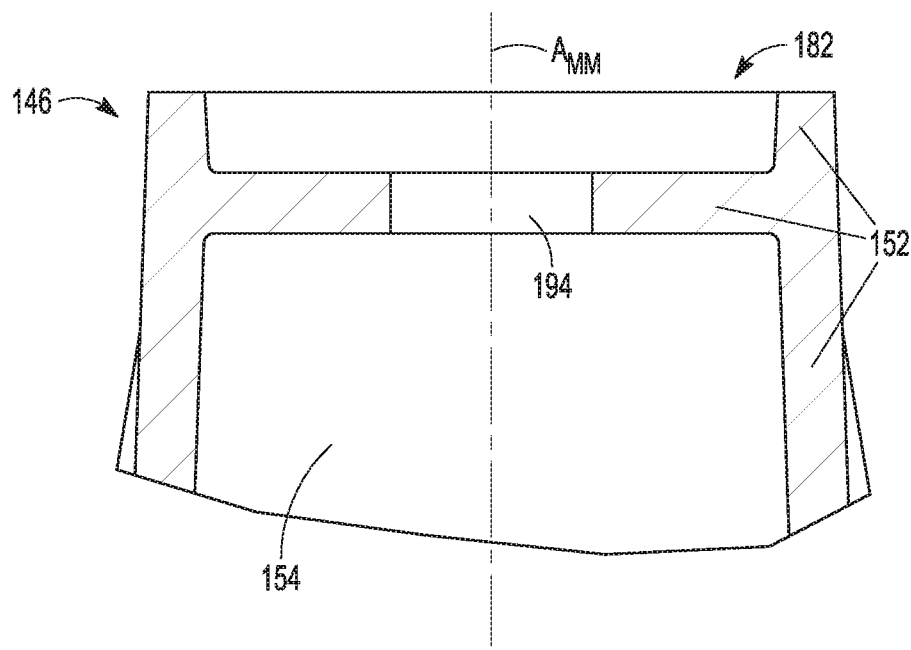
FIG. 8G is a close-up detailed view of the distal mounting end of the example magnetic mount body of FIG. 8A.
Figure 8H:
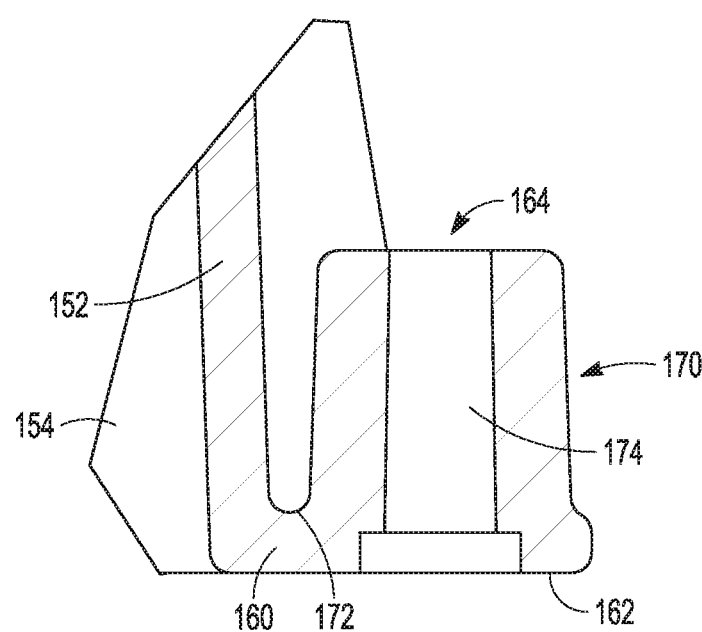
FIG. 8H is a close-up detailed view of a boss for receiving a fastener to couple the example magnetic mount body of FIG. 8A to another structure.

In an example, each fastener-end receiving hole 164 is at least partially surrounded by a boss 170 (best seen in FIGS. 8F and 8H). The boss 170 can provide more material in the axial direction of the fastener 148 that the fastener 148 can engage, e.g., so that the threading of the threaded shaft 168 can more securely engage with the mount body 150. In an example, the boss 170 comprises at least a portion of a generally cylindrical protrusion that projects upwardly from a top surface 172 of the flange 160. In an example, the boss 170 includes an inner bore 174 that extends axially through the boss 170, wherein the inner bore 174 is aligned with and overlaps the fastener-end receiving hole 164. In an example, at least a portion of the bore 174 or at least a portion of the fastener-end receiving hole 164, or both, includes interior threading that can threadingly engage the threaded shaft 168 of the fastener 148 that is inserted through the fastener-end receiving hole 164. In an example, the boss 170 has a height in the axial direction of the body 150 that is at least about 2.5 mm (about 0.1 inches), such as at least about 3 mm (about 0.12 inches), at least about 4 mm (about 0.16 inches), at least about 5 mm (about 0.2 inches), such as at least about 6 mm (about 0.24 inches), at least about 7 mm (about 0.28 inches), at least about 8 mm (about 0.31 inches), at least about 9 mm (about 0.35 inches), or at least about 10 mm (about 0.39 inches).

In examples where the flange 160 includes both one or more fastener holes 176 to receive the shaft 168 of a fastener 148 inserted from the same side of the structural member 122 as the magnetic mount 110 and one or more fastener-end receiving holes 164 to receive the shaft distal end of a fastener 148 inserted from the opposite side of the structural member 122, each fastener-end receiving hole 164 can be radially offset from a corresponding fastener hole 176 by a specified angle θ. In an example, best seen in FIG. 8B, the body 150 of the magnetic mount 110 includes a pair of two diametrically opposed fastener holes 176 and a pair of two diametrically opposed fastener-end receiving holes 164. The first fastener hole 176 (e.g., the top-most hole 176 in FIG. 8B) is radially spaced from the first fastener-end receiving hole 164 (e.g., the top-most hole 164 in FIG. 8B) by the angle θ. In an example, the second fastener hole 176 (e.g., the bottom-most hole 176 in FIG. 8B) is radially spaced from the second fastener-end receiving hole 164 (e.g., the bottom-most hole 164 in FIG. 8B) by the same angle θ. In an example, the angle θ is from about 15° to about 900, such as from about 30° to about 60°, for example about 45°.

In examples with this radial spacing, opposing magnetic mounts 110 that are to be fastened on opposite faces 136, 138 of the structural member 122 (such as a first magnetic mount 110A on the front face 136 and an opposing second magnetic mount 110B on the rear face 138 in FIG. 7) can be rotated relative to each other by the angle θ to align the fastener holes 176 of the first magnetic mount 110A with the fastener-end receiving holes 164 of the second magnetic mount 110B and vice versa. This allows one or more fasteners 148A that are inserted from the side of the front face 136 to be inserted into the fastener holes 176A of the first magnetic mount 110A, through fastener-receiving openings 166 in the structural member 122, and into the fastener-end receiving holes 164B of the second magnetic mount 110B on the rear face 138. Similarly, one or more fasteners 148B can be inserted from the side of the rear face 138 into the fastener holes 176B of the second magnetic mount 110B, through fastener-receiving openings 166 in the structural member 122, and into the fastener-end receiving holes 164A of the first magnetic mount 110A on the front face 136.

In an example, one or more cleats 178 are coupled to the bottom surface 162 of the one or more flanges 160 such that each cleat 178 extends axially away from the bottom surface 162. Each cleat 178 can be sized and shaped to fit within a cleat-receiving opening formed in the surface onto which the fastening end 144 of the body 150 is to be fastened. For example, when the magnetic mount 110 is being fastened to a face 136, 138 of the structural member 122, the face 136, 138 can include one or more cleat-receiving openings 180 (best seen in the detail inset of FIG. 5) that are each sized to receive all or substantially all of a corresponding cleat 178. The cleats 178 and cleat-receiving openings 180 allow for more precise positioning and alignment of the magnetic mounts 110 while they are being fastened onto the structure to which they are to be fastened, such as a face 136, 138 of the structural member 122.

In an example, the magnetic-mounting end 146 of the magnetic mount body 150 includes a locating structure 182 to maintain alignment and relative position of the magnetic mount 110 with respect to the mating magnetic structure 142 (i.e., a mating magnet 142) to provide for the magnetic engagement between the magnetic mount 110 and the mating structure 142. The locating structure 182 can also assist an installer during mounting of a display modules 112 so that the installer can be more confident in properly positioning the magnetic mounts 110 relative to the mating structure 156 where the mating magnetic structure 142 is located. The mating structure 156 includes a corresponding mating locating structure 184 with a profile that corresponds to and mates with or substantially mates with the profile of the locating structure 182.

As used herein, the term "profile" refers to the physical three-dimensional shape that forms the outline of at least a portion of the structure in question, particularly when referring to the profiles of the locating structures 182, 184. The term "mates or substantially mates," as used herein when referring to the profiles of the locating structures 182 and 184, refers to the physical profile of the locating structure 182 being the same or substantially the same as the physical profile of the mating locating structure 184 so that at least a portion of the locating structure 182 will fit together with at least a portion of the mating locating structure 184 with a close fit or a substantially close fit. In at least some examples, the concept of the profiles of the locating structures 182, 184 corresponds to what is often generally referred to as a "male-female" arrangement, i.e., with one of the locating structures 182 or 184 comprising a "male profile" and the other locating structure 182, 184 comprising a corresponding "female profile." In some examples, at least a portion of the male profile is a mirror- or reversed-image version of a corresponding portion of the female profile, with at least the portion of the male profile being inserted into the corresponding portion of the female profile.

In the example best seen in FIGS. 7, 8B, 8D, 8F, and 8G, the locating structure 182 is a generally cup-shaped structure at the distal end 146 of the magnetic mount body 150, which will also be referred to as the "locating cup 182." Similarly, the mating structure 156 can be a generally button-shaped structure, also referred to as a "mating button 156," having a distal button end that is sized and shaped to be received at least partially in the locating cup 182. For this reason, the mating locating structure 184 will also be referred to as the mating button end 184. In this example, the outer contour of the mating button end 184 has the same shape as the inner contour of the locating cup 182 so that at least the mating button end 184 fits within the locating cup 182 with close or relatively close fit, as best seen in FIG. 7.

In some examples, the mating profiles of the locating structure 182 and the mating locating structure 184 are such that when the locating structure 182 of the magnetic mount 110 is properly positioned and aligned relative to the mating locating structure 184, the locating structure 182 will slide into place with respect to the corresponding locating structure 184 in a noticeable way. This allows the installer to "known by feel" that the magnetic mount 110 has been properly positioned, which in turn lets the installer know that magnetic engagement has occurred between the mounting magnet 140 and the mating magnetic structure 142. For example, with the locating cup 182 and the mating button 156 shown in the figures, when an installer is positioning the display module 112, the display module 112 can be moved until the mating button end 184 is "captured" by one a lip 186 that forms the locating cup 182. The installer can then know that the display module 112 is, at worst, close to being properly positioned and aligned. Also, in some examples, once the mating button end 184 is at least partially caught by the lip 186, the magnetic attraction forces between the mounting magnet 140 and the mating magnetic structure 142 (i.e., the mating magnet 142) will tend to draw the full mating button end 184 into the locating cup 182. In some examples, the installer may feel the direction of the magnetic attraction force and can use it as a guide to place the display module 112 in a proper final position so that the magnetic mounts 110 are properly positioned and aligned for magnetic engagement that will hold the display module 112 in position.

Those of skill in the art will appreciate that while the example shown in FIGS. 7 and 8B, 8D, 8F, and 8G show the locating structure 182 of the magnetic mount 110 as a locating cup 182 and the mating locating structure 184 of the mating structure 156 as a mating button end 184, the locating structure 182 on the magnetic mount body 150 and the mating locating structure 184 on the mating structure 156 are not limited to these specific physical configurations. Rather, those of skill in the art will understand that any other combination of locating structure and mating locating structure can be used without varying from the scope of the invention. For example, the "cup" and "button" can be reversed, with the locating structure 182 at the mounting end 146 of the magnetic mount body 150 being a button-shaped structure and the mating locating structure 184 of the mating structure 156 being a cup. Also, locating structures other than a button and cup combination can be used in place of or in addition to the locating cup and mating button described herein, including, but not limited to, a pin or boss and a corresponding hole, a tab and a corresponding slot, a unique three-dimensional profile and a mirror-image or reverse-image three dimensional mating profile, and the like.

As noted above, in some examples, the mating magnetic structure 142 is a second magnet 142, referred to as the mating magnet 142. In such an example, the polarity of the mounting magnet 140 and its corresponding mating magnet 142 are oriented so that a distal pole of the mounting magnet 140 (i.e., the magnetic pole of the mounting magnet 140 that is oriented toward the distal end 146 of the body 150) is opposite that of a distal pole of the mating magnet 142 (i.e., the magnetic pole of the mating magnet 142 that is oriented toward the mating button end 184 of the mating button 156). This opposite polarity will allow the magnets 140, 142 to generate a magnetic attraction force therebetween to attract the magnetic mount 110 to the mating magnetic structure 142. For example, if the north pole of the mounting magnet 140 is oriented toward the distal mounting end 146 of the body 150, as shown in FIG. 7 (as indicated by the "N" on the mounting magnet 140), then the mating magnet 142 would be oriented so that its south pole is directed toward the mating button end 184 (as indicated by the "S" on the mating magnet 142 in FIG. 7). In an example, both the mounting magnet 140 and the mating magnet 142 are substantially the same, meaning that both magnets 140, 142 are made from the same magnetic material or combination of magnetic materials and have the same magnet geometry, as shown in FIG. 7.

In an example, the magnetic mount body 150 also includes one or more reinforcing structures to enhance one or more mechanical properties of the body 150, such as rigidity, compression strength, torsional strength, or other mechanical properties of the body 150 (and particularly of the main body portion 158). In an example, best seen in FIGS. 8A, 8B, 8D, 8E, and 8F, the magnetic mount body 150 includes a plurality of reinforcing fins 186 that extend along at least a portion of the main body portion 158. In the example shown in FIGS. 8A, 8B, 8D, 8E, and 8F, the reinforcing fins 186 extend in the axial direction A or substantially in the axial direction A in order to enhance the strength of the magnetic mount body 150 in the axial direction A. The presence of the fins 186 can add structural integrity to the body 150, and in particular can add strength in the axial direction A that can help the magnetic mount body 150 to resist crushing during installation of the display module 112 or use of the banner display 100 or from being pulled apart in the axial direction A when the display module 112 is disengaged from the structural member 122.

In the example shown, each fin 186 is generally triangular in shape. As is known generally, triangular structures can add structural integrity or strength in the direction of the plane of the triangle. In an example, the triangular shape of each fin 186 includes one side running along the outside of the main body portion 158 from a relatively sharp upper apex 188 at or proximate to the distal end 146 if the body 150 down to the flange 160. A short base 190 of the triangular shape of the fin 186 extends radially outward along the top surface 172 of the flange 160, and the outer edge 192 of the fin 186 extends from the radial end of the base 190 on the flange 160 to the apex 190. In examples where the main body portion 158 is cylindrical or slightly frustoconical (as in FIG. 8F), the fins 186 can generally have the shape of a right triangle (or a slightly obtuse scalene triangle in the case of a frustoconical main body portion 158) with one leg (that side that runs along the outside of the main body portion 158) being substantially longer than the other leg (i.e., the base 190), and with the outer edge of the fin 186 corresponding to the hypotenuse of the right triangle.

In an example, the body 150 includes at least three (3) reinforcing fins 186, for example at least four (4) reinforcing fins 186, such as at least five (5) reinforcing fins 186, for example at least six (6) reinforcing fins 186, such as at least seven (7) reinforcing fins 186, and in the example shown in FIG. 8B the body 150 includes eight (8) reinforcing fins 186. In an example, the fins 186 are evenly radially spaced around the main body portion 158. For example, as best seen in FIG. 8B, in an example where the reinforcing fins 186 are planar or generally planar, an angle α is formed between adjacent fins 186, and in some examples, each angle α around the entirety of the body 150 is equal to every other angle α. In the example shown with eight (8) reinforcing fins 186, the angle α is equal or approximately equal to 45°. In other words, in an example, the reinforcing fins 186 are regularly and evenly spaced around the main body portion 158.

As described above, in an example the magnetic mount body 150 is hollow and includes a cavity 154 in which the mounting magnet 140 is placed. In an example, the body 150 can include a magnet receiving hole 194 (FIGS. 8B-8D, 8F, and 8G) that can receive either a portion of the mounting magnet 140 or a fastener that couples the mounting magnet 140 to the body 150. The magnet receiving hole 194 is located at a position on the body 150 where it is desired that the mounting magnet 140 be located. In the example shown in FIGS. 7, 8D, 8F, and 8G, the magnet receiving hole 194 is located in the mounting end 146 of the body 150, such as within the locating cup 182.

The cavity 154 within the body 150 can also be used to align or position the magnetic mount 110 relative to the structural member 122. In an example, best seen in FIG. 7, a plurality of pegs 196 are coupled to the faces 136, 138 of the structural member 122. Each peg 196 provides a structure onto which the magnetic mount body 150 can be placed before fastening the magnetic mount 110 to the structural member 122, the pegs 196 will therefore also be referred to as body mounting pegs 196. In an example, an outer profile of each body mounting peg 196 substantially matches the interior profile of at least a portion of the cavity 154 within the body 150 so that when the magnetic mount body 150 is positioned over the peg 196 and fastened to the structural member 122, there is a tight or substantially tight engagement between the body mounting peg 196 and the magnetic mount body 150. The peg 196 can then act to maintain an alignment of the body 150 relative to the structural member 122 during use. The body mounting pegs 196 may also add additional support that can carry a portion of the weight of the display modules 112 and further ensure that the display modules 112 remain coupled to the structural member 122. In some examples, the body mounting pegs 196 can be fastened to the structural member 122, such as with fasteners, clamps, adhesives, welds, and the like.

Although the example banner displays 10 and 100 are described and shown herein as basic two-sided banner display with generally opposed displays, such as the front display surface 32 and the rear display surface 34 formed from a plurality of the display modules 12 in the banner display 10 or the front display surface 132 and the rear display surface 134 of the banner display 100, a banner display in accordance with the present disclosure is not so limited. Those of skill in the art will be able to readily conceive of other overall geometries, including more or fewer display surfaces than the front and rear display surfaces 32, 34 described above, with one or more of the display surfaces being mounted to a mounting structure with a plurality of magnetic mounts, similar or identical to the magnetic mounts 110 that mount the display modules 112 to the mounting structures 120 described above. For example, a banner display can include one, three, four, five, or more display surfaces where the display modules of each of the display surfaces of the banner display can be mounted to one or more mounting structures.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B." unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A display comprising:
a mounting structure comprising one or more structural members having a first face and a second face;
a first plurality of display modules each including a first front face and a first rear face, wherein the first rear faces of the first plurality of display modules are mounted to the first faces of the one or more structural members with a plurality of magnetic mounts, wherein the first front faces of the first plurality of display modules are arranged in proximity to form a first display surface,
wherein each of the plurality of magnetic mounts comprises:
a mount body having a first end, a second end, and a cavity therein, wherein the first end is fastened to a first one of the first face of a corresponding structural member or to the first rear face of a corresponding display module; and
a first magnet within the cavity of the mount body, wherein the first magnet is not fastened to the mount body and can move within the cavity so that an orientation of the first magnet can be changed by a corresponding magnetic polarity of a second magnet to orient a magnetic polarity of the first magnet relative to the corresponding magnetic polarity of the second magnet so that the first magnet magnetically engages with the second magnet, wherein the display further comprises a mating structure comprising the second magnet coupled to the other one of the first face of the corresponding structural member or the first rear face of the corresponding display module; and one or more tension members coupled to the mounting structure, wherein the display hangs from the one or more tension members.

2. The display according to claim 1, wherein each of the magnetic mounts further comprises a locating structure at the second end of the mount body, the locating structure having a first profile, and wherein each mating structure includes a mating locating structure with a second profile that mates or substantially mates with the first profile.

3. The display according to claim 2, wherein the locating structure comprises a locating cup and the mating locating structure comprises a button.

4. The display according to claim 1, wherein each of the magnetic mounts further comprises a flange extending radially outward from the mount body at the first end, wherein the flange is abutted against the first face of the corresponding structural member or against the first rear face of the corresponding display module.

5. The display according to claim 4, further comprising one or more fasteners extending through the flange and into the corresponding structural member or the corresponding display module to fasten the mount body to the corresponding structural member or to the corresponding display module.

6. The display according to claim 5, wherein the flange further comprises a fastener hole for each fastener extending through the flange.

7. The display according to claim 6, wherein each of the magnetic mounts further comprises one or more bosses coupled to a top surface of the flange, each boss at least partially surrounding a corresponding one of the fastener holes, the boss comprising a bore extending therethrough for receiving a corresponding one of the one or more fasteners, wherein the bore is substantially aligned with the corresponding fastener opening.

8. The display according to claim 4, wherein each of the magnetic mounts further comprises one or more cleats extending axially downward from a bottom surface of the flange, wherein the corresponding structural member or the corresponding display module further comprises a corresponding cleat opening for each of the one or more cleats.

9. The display according to claim 1, wherein each of the magnetic mounts further comprises a plurality of reinforcing structures extending axially along at least a portion of the mount body between the first end and the second end.

10. The display according to claim 1, wherein the one or more structural members comprise one or more composite members.

11. The display according to claim 10, wherein each of the one or more composite members comprises a composite sandwich panel comprising a core formed from a plurality of generally cylindrical cells and a pair of surface sheets each coupled to an opposing side of the core.

12. The display according to claim 11, wherein the plurality of generally cylindrical cells comprises one or more cross-sectional shapes, and the plurality of generally cylindrical cells is arranged in a honeycomb pattern.

13. The display according to claim 11, wherein the composite sandwich panel is planar or substantially planar and wherein each of the generally cylindrical cells is aligned in an axial direction that is normal or substantially normal to a plane of the planar or substantially planar composite sandwich panel.

14. The display according to claim 11, wherein the plurality of generally cylindrical cells covers a substantial portion of a surface area of the core.

15. The display according to claim 11, wherein the plurality of generally cylindrical cells covers substantially the entirety of a surface area of the core.

16. The display according to claim 11, wherein the plurality of generally cylindrical cells and the pair of surface sheets comprise aluminum.

17. The display according to claim 1, further comprising a second plurality of display modules each including a second front face and a second rear face, wherein the second rear faces of the second plurality of display modules are mounted to the second faces of the one or more structural members, wherein the second front faces of the second plurality of display modules are arranged in proximity to form a second display surface.

18. The display according to claim 17, wherein the second display surface is parallel or substantially parallel to and opposing the first display surface.

* * * * *